(12) United States Patent
Lin

(10) Patent No.: US 10,431,559 B2
(45) Date of Patent: Oct. 1, 2019

(54) METHOD FOR MANUFACTURING A SEMICONDUCTOR STRUCTURE

(71) Applicant: NANYA TECHNOLOGY CORPORATION, New Taipei (TW)

(72) Inventor: Po Chun Lin, Changhua (TW)

(73) Assignee: NANYA TECHNOLOGY CORPORATION, Taoyuan (TW)

(*) Notice: Subject to any disclaimer, the term of this patent is extended or adjusted under 35 U.S.C. 154(b) by 0 days.

(21) Appl. No.: 15/851,572

(22) Filed: Dec. 21, 2017

(65) Prior Publication Data
US 2018/0114764 A1  Apr. 26, 2018

Related U.S. Application Data

(62) Division of application No. 15/271,748, filed on Sep. 21, 2016, now Pat. No. 10,103,114.

(51) Int. Cl.
*H01L 23/00* (2006.01)
*H01L 23/31* (2006.01)
(Continued)

(52) U.S. Cl.
CPC ............ *H01L 24/05* (2013.01); *H01L 21/56* (2013.01); *H01L 21/568* (2013.01); *H01L 23/3171* (2013.01); *H01L 23/3192* (2013.01); *H01L 23/49811* (2013.01); *H01L 23/562* (2013.01); *H01L 24/03* (2013.01); *H01L 24/08* (2013.01); *H01L 24/11* (2013.01); *H01L 24/13* (2013.01); *H01L 24/16* (2013.01); *H01L 2224/03003* (2013.01); *H01L 2224/0346* (2013.01); *H01L 2224/03462* (2013.01);
(Continued)

(58) Field of Classification Search
None
See application file for complete search history.

(56) References Cited

U.S. PATENT DOCUMENTS 5,442,241 A   8/1995  Tane
5,477,611 A   12/1995 Sweis et al.
(Continued)

FOREIGN PATENT DOCUMENTS

CN   101346812 A   1/2009
CN   101924045 A   12/2010
(Continued)

OTHER PUBLICATIONS

Office Action dated Dec. 27, 2017 in corresponding Taiwan Application No. 105133944, together with partial English translation thereof, pp. 1-6.

*Primary Examiner* — Nishath Yasmeen
(74) *Attorney, Agent, or Firm* — Muncy, Geissler, Olds & Lowe, P.C.

(57) ABSTRACT

The present disclosure provides a method for manufacturing a semiconductor structure. The semiconductor structure includes a substrate; a pad disposed over the substrate; a first passivation disposed over the substrate, partially covering the pad, and including a protrusion protruded from the first passivation and away from the substrate; a conductive layer disposed over the first passivation and a portion of the pad exposed from the first passivation; and a second passivation disposed over the conductive layer, wherein the conductive layer disposed over the protrusion is exposed from the second passivation.

7 Claims, 41 Drawing Sheets

(51) Int. Cl.
*H01L 21/56* (2006.01)
*H01L 23/498* (2006.01)

(52) U.S. Cl.
CPC .......... *H01L 2224/0401* (2013.01); *H01L 2224/05026* (2013.01); *H01L 2224/05548* (2013.01); *H01L 2224/05557* (2013.01); *H01L 2224/05558* (2013.01); *H01L 2224/05567* (2013.01); *H01L 2224/05572* (2013.01); *H01L 2224/05611* (2013.01); *H01L 2224/05616* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2924/351* (2013.01)

(56) References Cited

U.S. PATENT DOCUMENTS

| | | |
|---|---|---|
| 5,998,875 A | 12/1999 | Bodoe et al. |
| 6,103,552 A | 8/2000 | Lin |
| 6,197,613 B1 | 3/2001 | Kung et al. |
| 6,277,669 B1 | 8/2001 | Kung et al. |
| 6,400,021 B1 | 6/2002 | Cho |
| 6,433,427 B1 | 8/2002 | Wu |
| 6,555,908 B1 | 4/2003 | Eichelberger et al. |
| 6,593,220 B1 | 7/2003 | Yu et al. |
| 6,649,507 B1 | 11/2003 | Chen et al. |
| 6,818,544 B2 | 11/2004 | Eichelberger et al. |
| 6,867,505 B2 | 3/2005 | Lee et al. |
| 7,129,111 B2 | 10/2006 | Tsai |
| 7,196,000 B2 | 3/2007 | Lee |
| 7,476,968 B2 | 1/2009 | Shindo |
| 7,682,959 B2 | 3/2010 | Lin et al. |
| 7,749,886 B2 | 7/2010 | Oganesian et al. |
| 7,863,740 B2 | 1/2011 | Ke et al. |
| 7,964,450 B2 | 6/2011 | Camacho et al. |
| 8,058,735 B2 | 11/2011 | Lee et al. |
| 8,253,248 B2 | 8/2012 | Ke et al. |
| 8,283,781 B2 | 10/2012 | Wu et al. |
| 8,304,904 B2 | 11/2012 | Lin et al. |
| 8,354,750 B2 | 1/2013 | Wang et al. |
| 8,513,532 B2 | 8/2013 | Chen et al. |
| 8,643,150 B1 | 2/2014 | Xu et al. |
| 8,906,798 B2 | 12/2014 | Wang et al. |
| 8,946,891 B1 | 2/2015 | Nangalia et al. |
| 2002/0076911 A1 | 6/2002 | Lin |
| 2002/0137304 A1 | 9/2002 | Yih et al. |
| 2005/0127508 A1 | 6/2005 | Lee et al. |
| 2006/0097407 A1 | 5/2006 | Ito |
| 2006/0138677 A1 | 6/2006 | Khandros et al. |
| 2007/0015312 A1 | 1/2007 | Tsai |
| 2007/0102829 A1 | 5/2007 | Lo et al. |
| 2007/0145550 A1* | 6/2007 | Haba ............... H01L 21/6835 257/678 |
| 2009/0057924 A1* | 3/2009 | Imai ..................... H01L 24/10 257/784 |
| 2009/0160052 A1 | 6/2009 | Yang et al. |
| 2009/0291554 A1* | 11/2009 | Lin ..................... H01L 24/13 438/614 |
| 2011/0186987 A1 | 8/2011 | Wang et al. |
| 2011/0266668 A1 | 11/2011 | Haba |
| 2012/0043115 A1 | 2/2012 | Chen et al. |
| 2012/0129335 A1* | 5/2012 | Ikumo ............... H01L 23/3192 438/614 |
| 2013/0015575 A1 | 1/2013 | Lin et al. |
| 2013/0109169 A1 | 5/2013 | Wang et al. |
| 2014/0027900 A1 | 1/2014 | Chiu et al. |
| 2014/0077359 A1 | 3/2014 | Tsai et al. |
| 2014/0312512 A1 | 10/2014 | Choi |

FOREIGN PATENT DOCUMENTS

| | | |
|---|---|---|
| CN | 103794513 A | 5/2014 |
| CN | 104362105 A | 2/2015 |

\* cited by examiner

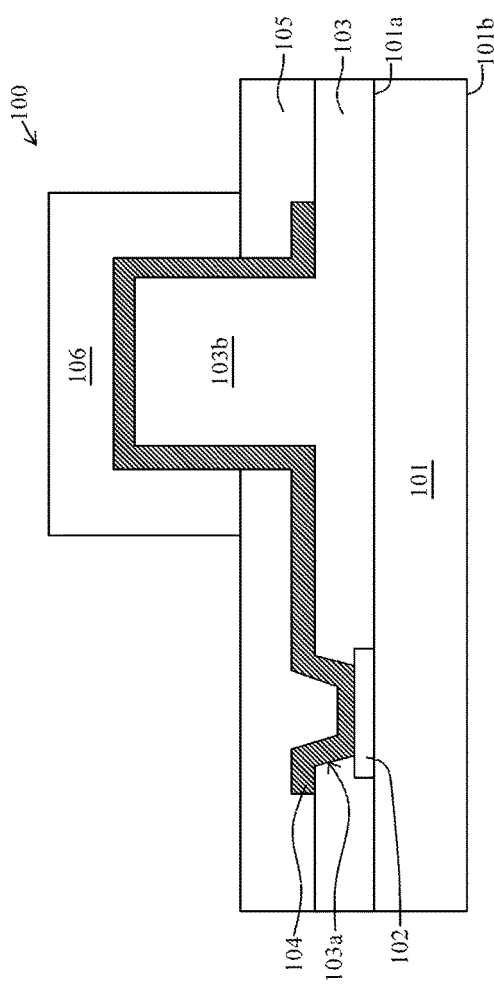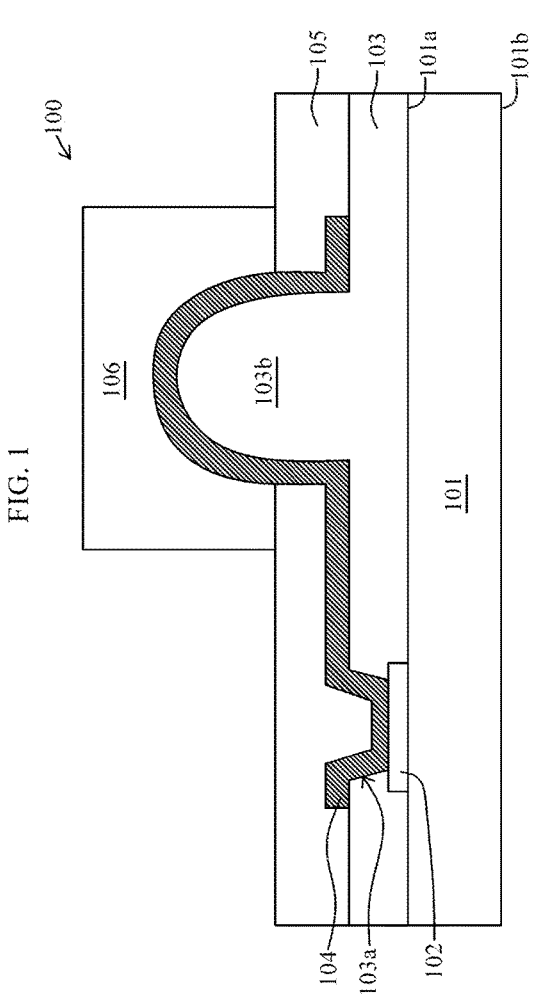

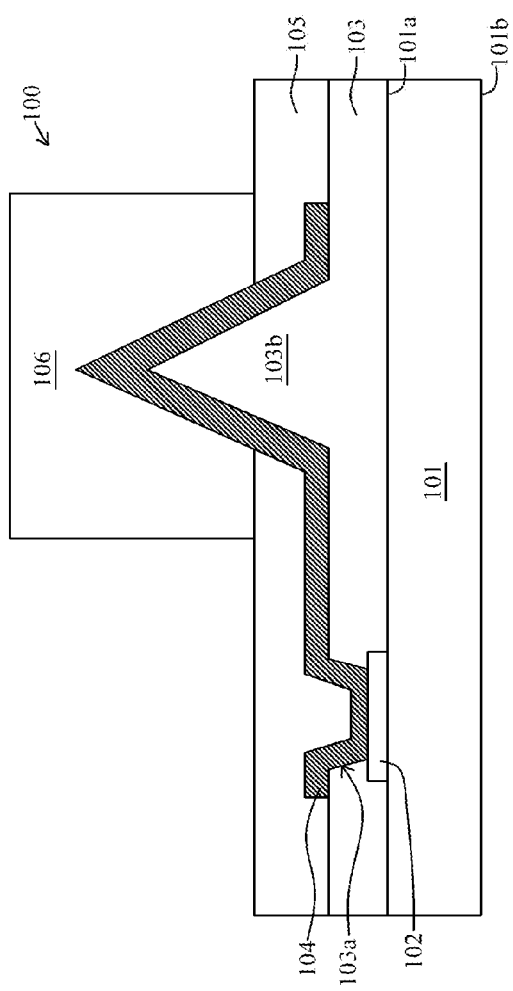
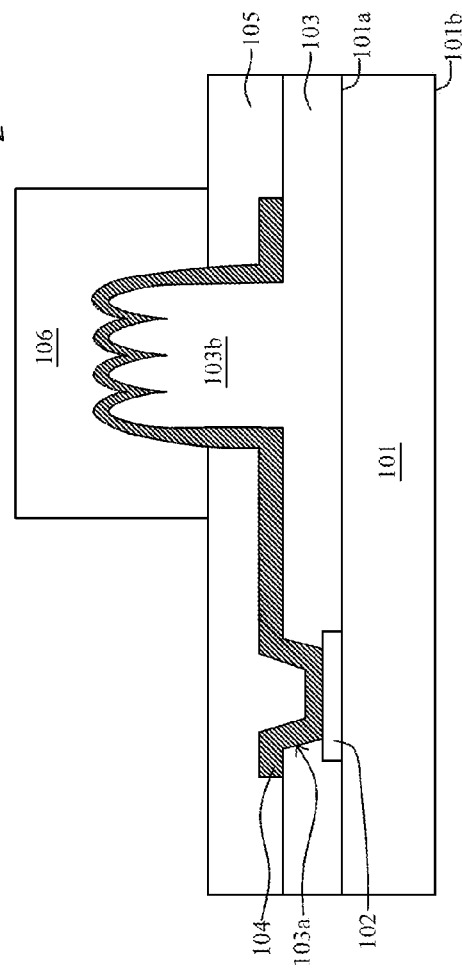

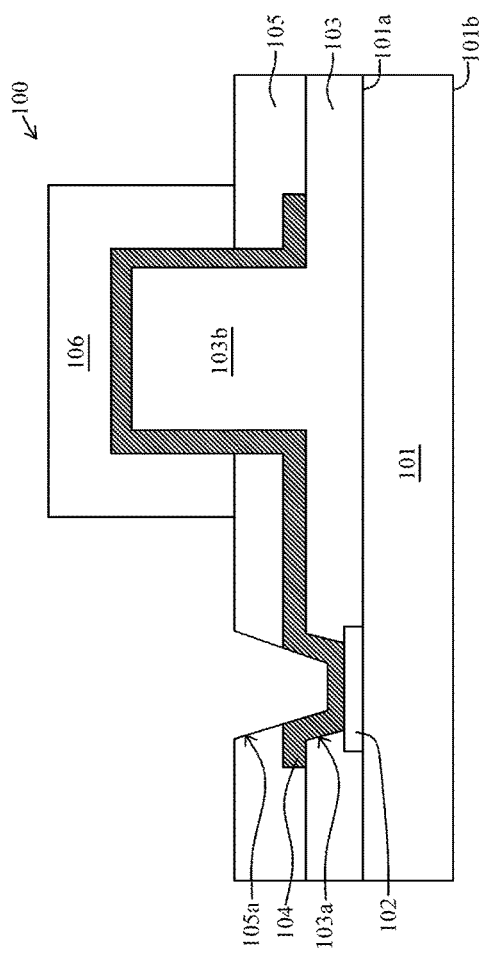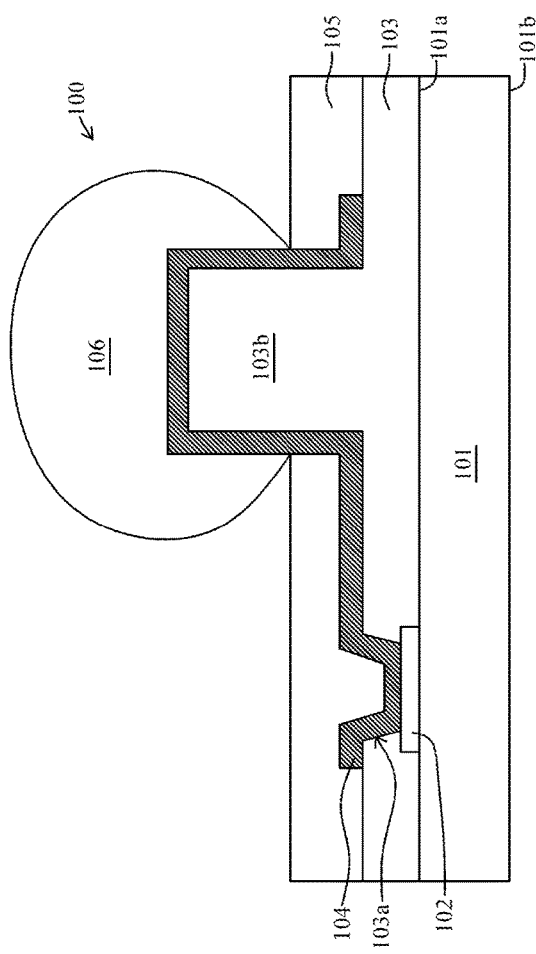

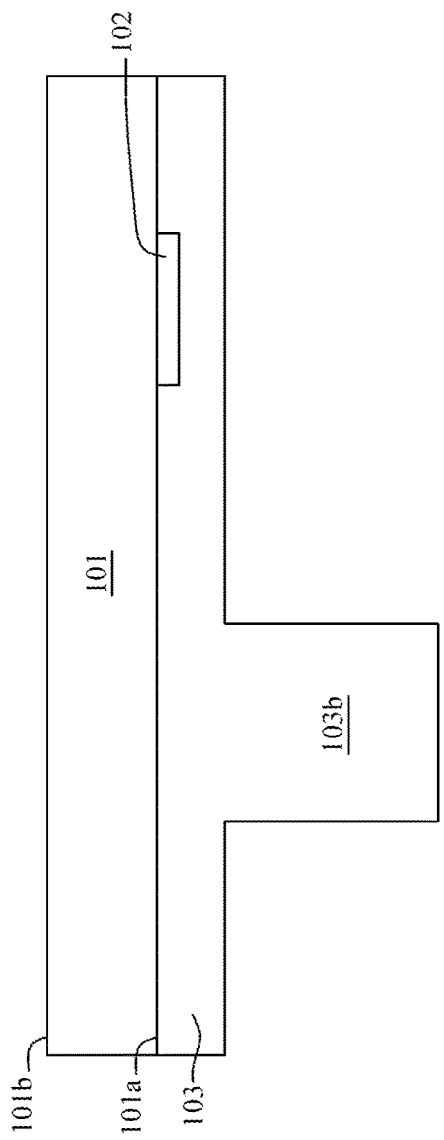
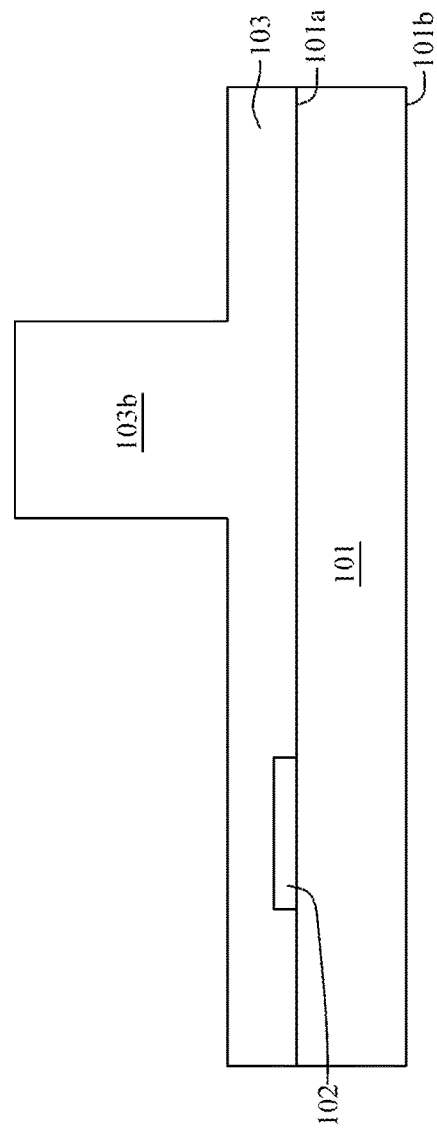
FIG. 17
FIG. 18

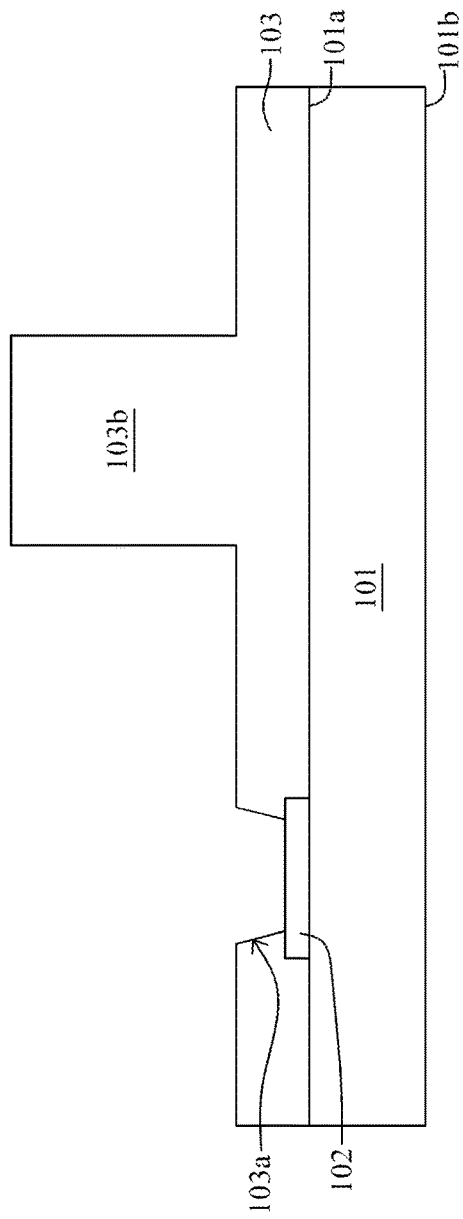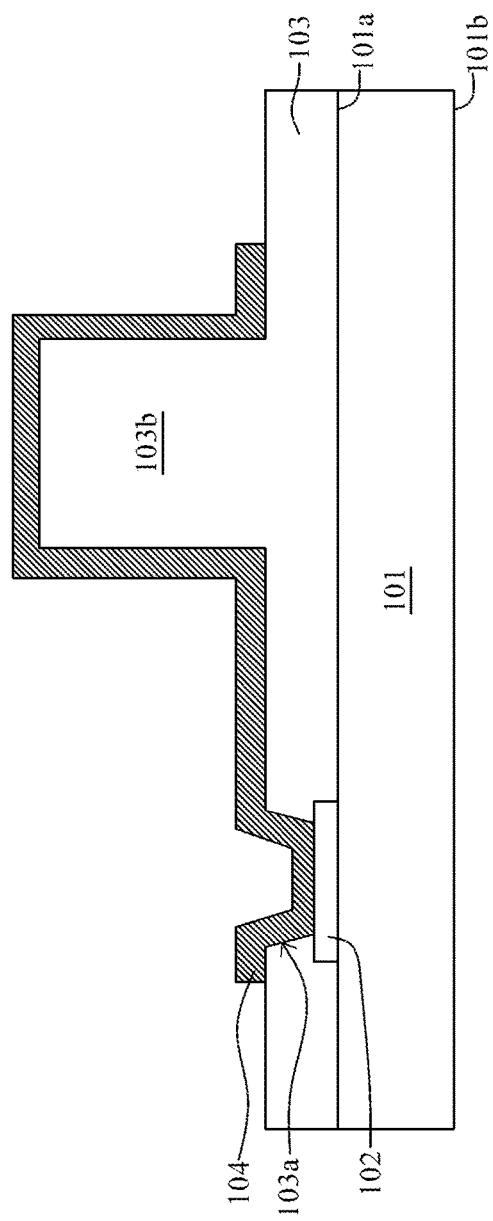
FIG. 19
FIG. 20

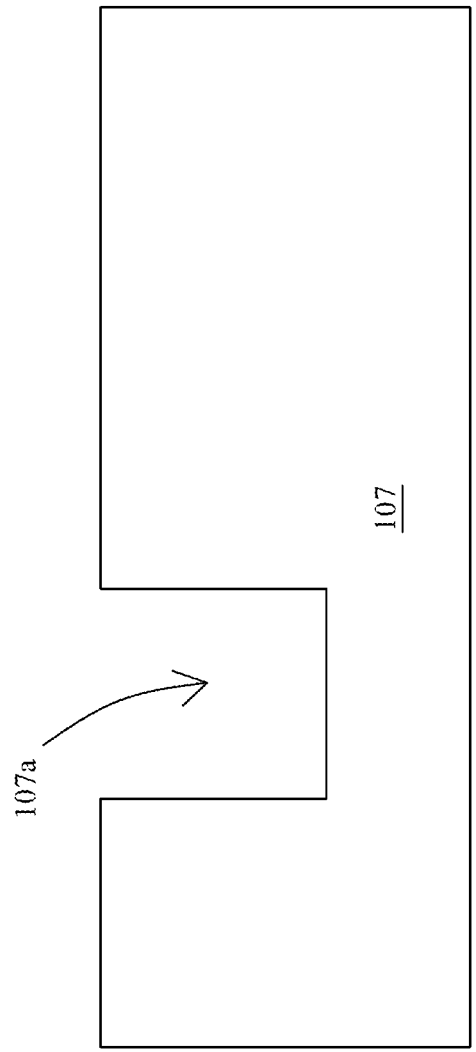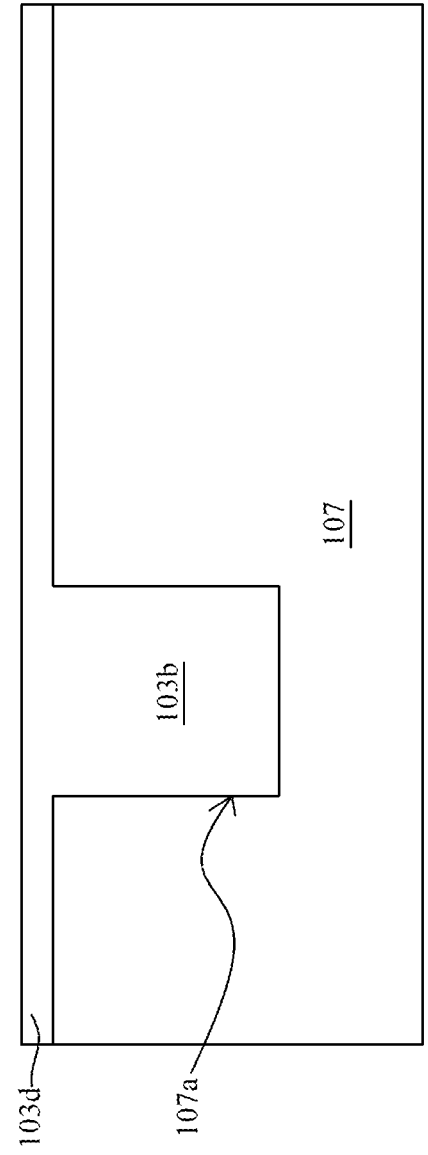
FIG. 25
FIG. 26

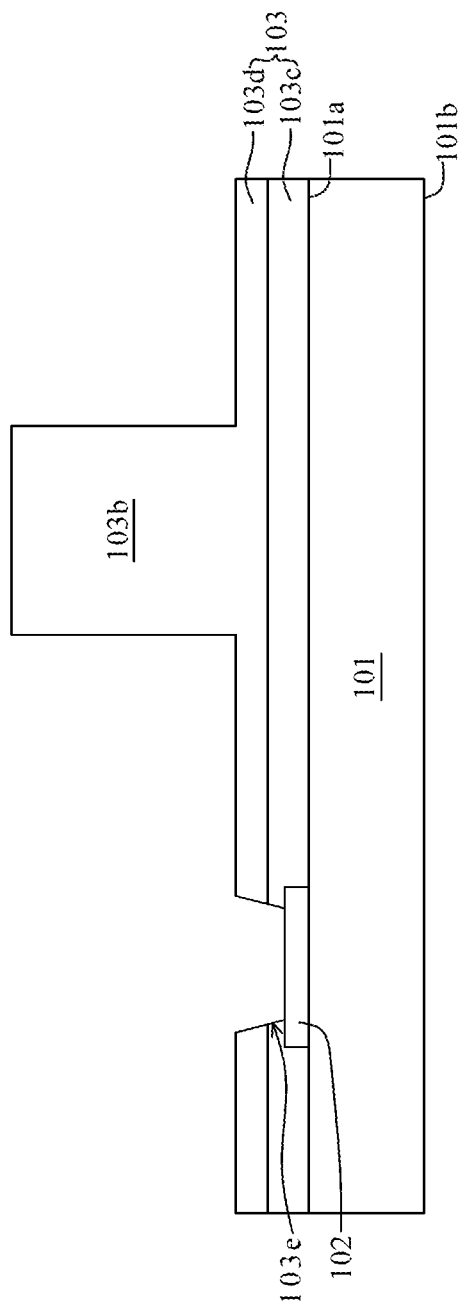
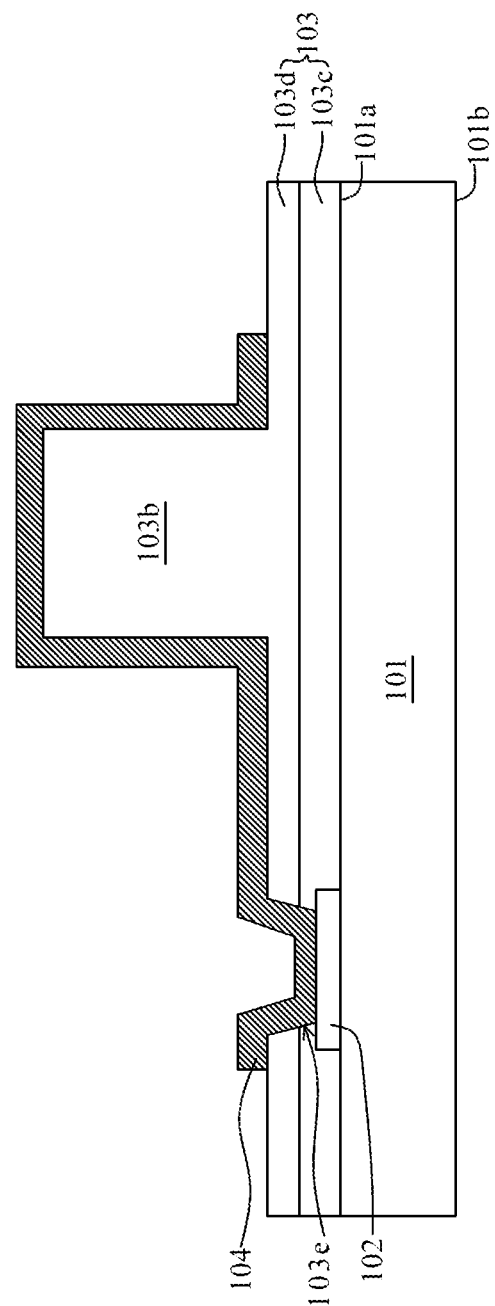

METHOD FOR MANUFACTURING A SEMICONDUCTOR STRUCTURE

PRIORITY CLAIM AND CROSS-REFERENCE

This patent application is a divisional application of and claims priority to U.S. patent application Ser. No. 15/271,748, filed on Sep. 21, 2016, which is incorporated by reference in its entirety.

TECHNICAL FIELD

The present disclosure relates to a semiconductor structure comprising a passivation which includes a protrusion for absorbing or relieving a stress over the semiconductor structure.

DISCUSSION OF THE BACKGROUND

Semiconductor devices are essential for many modern applications. With the advancement of electronic technology, semiconductor devices are becoming increasingly smaller in size while having greater functionality and greater amounts of integrated circuitry. Due to the miniaturized scale of semiconductor devices, wafer level chip scale packaging (WLCSP) is widely used for manufacturing. Numerous manufacturing steps are implemented within such small semiconductor devices.

However, the manufacturing of semiconductor devices in a miniaturized scale is becoming more complicated. An increase in the complexity of manufacturing semiconductor devices may cause deficiencies such as poor electrical interconnection, development of cracks or delamination of components. As such, there are many challenges for modifying the structure and manufacturing of semiconductor devices.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY

One aspect of the present disclosure provides a semiconductor structure comprising a substrate; a pad disposed over the substrate; a first passivation disposed over the substrate, surrounding the pad, and including a protrusion protruded from the first passivation and away from the substrate; a conductive layer disposed over the first passivation and a portion of the pad exposed from the first passivation; and a second passivation disposed over the conductive layer, wherein the conductive layer disposed over the protrusion is exposed from the second passivation.

In some embodiments, the conductive layer is disposed conformal to the protrusion.

In some embodiments, the conductive layer is electrically connected with the pad.

In some embodiments, the first passivation is integrally formed with the protrusion.

In some embodiments, the first passivation includes elastomer, epoxy or polyimide.

In some embodiments, the second passivation includes an opening exposing the conductive layer disposed over the pad.

In some embodiments, the first passivation includes a first dielectric layer disposed over the substrate and partially covering the pad, and a second dielectric layer disposed over the first dielectric layer, partially covering the pad and including the protrusion protruded from the second dielectric layer and away from the first dielectric layer.

In some embodiments, the semiconductor structure further comprises a conductive bump covering the conductive layer exposed from the second passivation.

In some embodiments, the conductive bump is electrically connected to the pad through the conductive layer.

In some embodiments, the conductive bump surrounds the protrusion, or the protrusion is protruded into the conductive bump.

Another aspect of the present disclosure provides a method of manufacturing a semiconductor structure which includes providing a carrier including a recess, disposing a first passivation over the carrier and filling the recess, providing a substrate including a pad disposed thereon, bonding the first passivation with the substrate to insert the pad into the first passivation, removing the carrier, removing a portion of the first passivation to expose a portion of the pad, disposing a conductive layer over the first passivation and the portion of the pad, disposing a second passivation over the conductive layer, wherein the first passivation includes a protrusion protruded from the first passivation and away from the substrate, and the conductive layer disposed over the protrusion is exposed from the second passivation.

In some embodiments, the method further includes disposing a release film over the carrier and the recess prior to the disposing of the first passivation, or curing the first passivation after the bonding of the substrate with the first passivation, or flipping the substrate bonded with the first passivation prior to the removal of the carrier, or disposing a conductive bump over the conductive layer exposed from the second passivation.

In some embodiments, the disposing of the first passivation includes spin coating.

In some embodiments, the disposing of the conductive layer includes plating, electroplating or electroless plating.

In some embodiments, the protrusion is disposed within the recess.

In some embodiments, the first passivation includes a first dielectric layer and a second dielectric layer, wherein the first dielectric layer is disposed over the substrate and covers the pad, the second dielectric layer is disposed over the carrier and fills the recess, the first dielectric layer is bonded with the second dielectric layer, and a portion of the first dielectric layer and a portion of the second dielectric layer are removed to expose the portion of the pad.

In some embodiments, the first passivation includes a first dielectric layer and a second dielectric layer, the first dielectric layer is disposed over the substrate, covers the pad and includes the protrusion protruded from the first dielectric layer and away from the substrate, the second dielectric layer is disposed conformal to the first dielectric layer and the protrusion, and a portion of the first dielectric layer and a portion of the second dielectric layer are removed to expose the portion of the pad.

Another aspect of the present disclosure provides a method of manufacturing a semiconductor structure which includes providing a carrier including a recess, disposing a second passivation over the carrier, disposing a conductive layer over the second passivation and the recess, disposing a first passivation over the conductive layer and the second passivation, providing a substrate including a pad disposed thereon, bonding the substrate with the first passivation to insert the pad into the first passivation, disposing the pad over the conductive layer, removing the carrier, removing a portion of the second passivation to expose a portion of the conductive layer, wherein the first passivation includes a protrusion protruded from the first passivation and away from the substrate, and the portion of the conductive layer exposed from the second passivation is disposed over the protrusion.

In some embodiments, the second passivation is disposed conformal to a sidewall of the recess, or the conductive layer is disposed conformal to the second passivation.

In some embodiments, the method further includes disposing a release film over the carrier and the recess prior to the disposing of the second passivation, or curing the first passivation after the bonding of the substrate with the first passivation, or flipping the substrate bonded with the first passivation prior to the removal of the carrier, or disposing a conductive bump over the portion of the conductive layer exposed from the second passivation.

The foregoing has outlined rather broadly the features and technical advantages of the present disclosure in order that the detailed description of the disclosure that follows may be better understood. Additional features and advantages of the disclosure will be described hereinafter, which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

FIG. 1 is a schematic cross-sectional view of a semiconductor structure in accordance with some embodiments of the present disclosure.

FIGS. 2-4 are schematic cross-sectional views of the semiconductor structure having a protrusion in various shapes in accordance with some embodiments of the present disclosure.

FIG. 5 is a schematic cross-sectional view of a semiconductor structure having a portion of a conductive layer exposed in accordance with some embodiments of the present disclosure.

FIG. 6 is a schematic cross-sectional view of a semiconductor structure having a conductive bump in spherical shape in accordance with some embodiments of the present disclosure.

FIGS. 12-23 are schematic views of manufacturing the semiconductor structure by the method of FIG. 11 in accordance with some embodiments of the present disclosure.

FIGS. 25-36 are schematic views of manufacturing the semiconductor structure by the method of FIG. 24 in accordance with some embodiments of the present disclosure.

DETAILED DESCRIPTION

Figure 7:
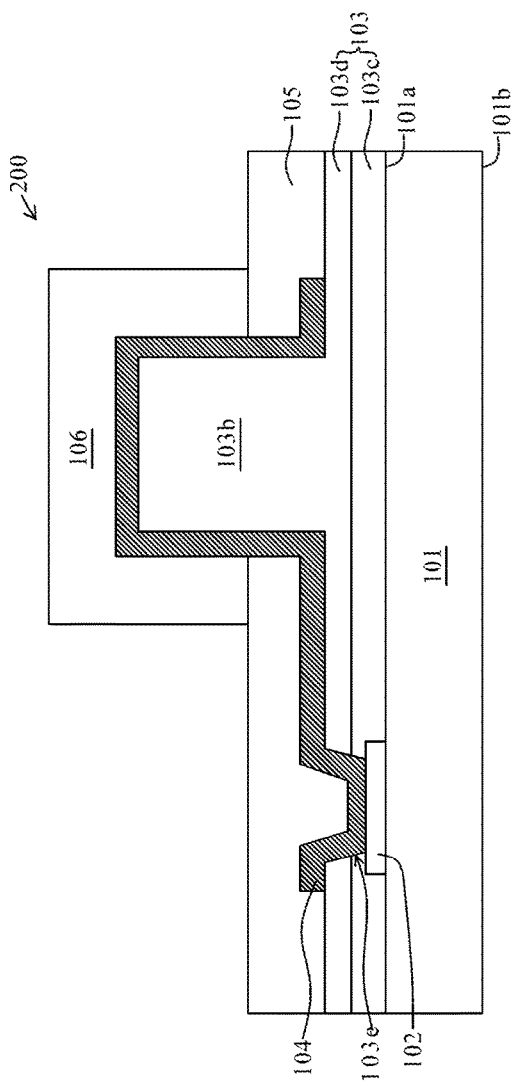
FIG. 7 is a schematic cross-sectional view of a semiconductor structure including two dielectric layers in accordance with some embodiments of the present disclosure.

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to a semiconductor structure comprising a passivation disposed over a substrate and including a protrusion protruded from the passivation and away from the substrate. In order to make the present disclosure completely comprehensible, detailed steps and structures are provided in the following description. Obviously, implementation of the present disclosure does not limit special details known by persons skilled in the art. In addition, known structures and steps are not described in detail, so as not to limit the present disclosure unnecessarily. Preferred embodiments of the present disclosure will be described below in detail. However, in addition to the detailed description, the present disclosure may also be widely implemented in other embodiments. The scope of the present disclosure is not limited to the detailed description, and is defined by the claims.

A semiconductor structure is electrically connected with another chip or package through a connector, such as a bump, a pillar, a post or the like. The connector is disposed on the semiconductor structure and configured to bond with another chip or package. Upon bonding of the connector with another chip or package, a stress or a force would be acted on the connector and cause damage to the connector as well as those components under the connector. As such, a crack may be developed in the connector or may even propagate into the components of the semiconductor structure. Delamination of components may occur. As a result, failure of electrical connection would occur.

In the present disclosure, a semiconductor structure is disclosed. The semiconductor structure comprises a passivation disposed over a substrate and including a protrusion protruded from the passivation and away from the substrate. The protrusion can provide elasticity, and thus can absorb or relieve a stress over the semiconductor structure during manufacturing or developed during thermal processes. For example, a stress would be acted over the semiconductor structure when a connector is mounted over the protrusion or when the connector mounted over the protrusion is bonded with another semiconductor chip or package. Therefore, cracks in the semiconductor structure and delamination of components can be minimized or prevented. A reliability of the semiconductor structure can be improved.

FIG. 1 is a cross-sectional view of a semiconductor structure 100 in accordance with some embodiments of the present disclosure. In some embodiments, the semiconductor structure 100 includes a substrate 101, a pad 102, a first passivation 103, a conductive layer 104, a second passivation 105 and a conductive bump 106. In some embodiments, the semiconductor structure 100 is a part of a die, a chip or a semiconductor package.

In some embodiments, the substrate 101 is fabricated with a predetermined functional circuit thereon. In some embodiments, the substrate 101 includes several conductive traces and several electrical components, such as transistors and diodes, connected by the conductive traces. In some embodiments, the substrate 101 is a semiconductive substrate. In some embodiments, the substrate 101 is a wafer. In some embodiments, the substrate 101 includes semiconductive material such as silicon, germanium, gallium, arsenic, and combinations thereof. In some embodiments, the substrate 101 is a silicon substrate. In some embodiments, the substrate 101 includes material such as ceramic, glass or the like. In some embodiments, the substrate 101 is a glass substrate. In some embodiments, the substrate 101 is in a quadrilateral, rectangular, square, polygonal or any other suitable shapes.

In some embodiments, the substrate 101 includes a first surface 101a and a second surface 101b opposite to the first surface 101b. In some embodiments, the first surface 101a is a front side or an active side where the circuits or electrical components are disposed thereon. In some embodiments, the second surface 101b is a back side or an inactive side.

In some embodiments, the pad 102 is disposed over the substrate 101. In some embodiments, the pad 102 is disposed over or within the first surface 101a of the substrate 101. In some embodiments, the pad 102 is disposed over the second surface 101b of the substrate 101. In some embodiments, the pad 102 is electrically connected to a circuitry or an electrical component in the substrate 101. In some embodiments, the pad 102 is electrically connected with a circuitry external to the substrate 101 so that the circuitry in the substrate 101 can electrically connect to the circuitry external to the substrate 101 through the pad 102. In some embodiments, the pad 102 is configured to receive a conductive structure. In some embodiments, the pad 102 is a die pad or a bond pad. In some embodiments, the pad 102 includes gold, silver, copper, nickel, tungsten, aluminum, palladium and/or alloys thereof.

In some embodiments, the first passivation 103 is disposed over the substrate 101. In some embodiments, the first passivation 103 is disposed over the first surface 101a or the second surface 101b of the substrate 101. In some embodiments, the first passivation 103 partially covers the pad 102 such that a portion of the pad 102 is exposed from the first passivation 103. In some embodiments, the first passivation 103 surrounds the pad 102. In some embodiments, the first passivation 103 includes a first opening 103a disposed over the pad 102. In some embodiments, the portion of the pad 102 is exposed from the first passivation 103 by the first opening 103a. In some embodiments, the portion of the pad 102 exposed from the first passivation 103 can receive a conductive structure or electrically connect to a circuitry external to the substrate 101.

In some embodiments, the first passivation 103 is configured to provide an electrical insulation and a moisture protection for the substrate 101 so that the substrate 101 is isolated from an ambient environment. In some embodiments, the first passivation 103 includes one or more layers of dielectric material stacking over each other. In some embodiments, the first passivation 103 is formed with dielectric materials, such as elastomer, epoxy, polyimide, polymer, resin, oxide or the like. In some embodiments, the first passivation 103 includes elastic, deformable, flexible or soft material, such that the first passivation 103 can provide flexibility or elasticity. In some embodiments, the first passivation 103 is elastic, deformable or compressible.

In some embodiments, the first passivation 103 includes a protrusion 103b protruded from the first passivation 103 and away from the substrate 101. In some embodiments, the protrusion 103b is disposed over and protruded away from the first surface 101a when the first passivation 103 is disposed over the first surface 101a. In some embodiments, the protrusion 103b is disposed over and protruded away from the second surface 101b when the first passivation 103 is disposed over the second surface 101b. In some embodiments, the protrusion 103b is integral with or separated from the first passivation 103. In some embodiments, the protrusion 103b is extended orthogonal to the substrate 101.

In some embodiments, the protrusion 103b includes elastomer, epoxy, polyimide, polymer, resin, oxide or the like. In some embodiments, the protrusion 103b includes elastic, deformable, flexible or soft material, such that the protrusion 103b can provide flexibility or elasticity. In some embodiments, the protrusion 103b is elastic, deformable or compressible.

In some embodiments, the protrusion 103b is in a cylindrical shape, or a cross section of the protrusion 103b is in a rectangular or quadrilateral shape. In some embodiments as shown in FIG. 2, the protrusion 103b is in a dome shape. In some embodiments as shown in FIG. 3, the protrusion 103b is in a prism shape, or a cross section of the protrusion 103b is in a triangular shape. In some embodiments as shown in FIG. 4, the protrusion 103b is in a polygonal or irregular shape.

Referring back to FIG. 1, in some embodiments, the conductive layer 104 is disposed over the first passivation 103. In some embodiments, the conductive layer 104 is disposed along a surface of the first passivation 103. In some embodiments, the conductive layer 104 is disposed over the portion of the pad 102 exposed from the first passivation 103 and disposed within the first opening 103a. In some embodiments, the conductive layer 104 is electrically connected with the pad 102. In some embodiments, the conductive layer 104 is disposed over and surrounds the protrusion 103b. In some embodiments, the conductive layer 104 is disposed conformal to the protrusion 103b. In some embodiments, the conductive layer 104 is disposed along an outer surface of the protrusion 103b. In some embodiments, the conductive layer 104 is a redistribution layer (RDL). In some embodiments, the conductive layer 104 includes copper, gold, silver, nickel, solder, tin, lead, tungsten, aluminum, titanium, palladium and/or alloys thereof.

In some embodiments, the second passivation 105 is disposed over the conductive layer 104. In some embodiments, the second passivation 105 at least partially covers the conductive layer 104. In some embodiments, the conductive layer 104 disposed over the protrusion 103b is exposed from the second passivation 105. In some embodiments, a portion of the conductive layer 104 and a portion of the protrusion 103b are exposed from the second passivation 105. In some embodiments, the second passivation 105 surrounds the protrusion 103b and the conductive layer 104 disposed over the protrusion 103b. In some embodiments, the protrusion 103b is protruded from the second passivation 105. In some embodiments, the second passivation 105 includes same material as or different material from the first passivation 103. In some embodiments, the second passivation 105 includes dielectric materials, such as oxide, nitride, polymer or the like.

In some embodiments as shown in FIG. 5, the second passivation 105 includes a second opening 105a exposing the conductive layer 104 disposed over the pad 102. In some embodiments, the second opening 105a is disposed over the pad 102. In some embodiments, the second opening 105a is disposed over the first opening 103a. In some embodiments, the conductive layer 104 exposed from the second passivation 105 by the second opening 105a can receive a conductive structure and can electrically connect to a conductive structure or an external circuitry.

Referring back to FIG. 1, in some embodiments, the conductive bump 106 is disposed over the second passivation 105. In some embodiments, the conductive bump 106 is disposed over or surrounds the protrusion 103b and the conductive layer 104 exposed from the second passivation 105. In some embodiments, the conductive bump 106 covers the conductive layer 104 exposed from the second passivation 105. In some embodiments, the protrusion 103b is at least partially protruded into the conductive bump 106. In some embodiments, the protrusion 103b is protruded from the first passivation 103 towards the conductive bump 106. In some embodiments, the conductive bump 106 is electrically connected to the pad 102 through the conductive layer 104.

In some embodiments, the conductive bump 106 is configured to bond with a conductive structure, a chip or a package. In some embodiments, the conductive bump 106 is a solder joint, a solder bump, a solder ball, a ball grid array (BGA) ball, a controlled collapse chip connection (C4) bump, a microbump or the like. In some embodiments, the conductive bump 106 is a conductive pillar or post. In some embodiments, the conductive bump 106 includes lead, tin, copper, gold, silver, nickel or combination thereof. In some embodiments, the conductive bump 106 is in a cylindrical shape. In some embodiments as shown in FIG. 6, the conductive bump 106 is in a spherical or hemispherical shape.

In some embodiments, the protrusion 103b is configured to absorb a force applied thereover. In some embodiments, the protrusion 103b can absorb a force applied over the conductive bump 106 or the semiconductor structure 100 such that development of cracks in the conductive bump 106 or the semiconductor structure 100 can be minimized or prevented.

FIG. 7 is a cross-sectional view of a semiconductor structure 200 in accordance with some embodiments of the present disclosure. In some embodiments, the semiconductor structure 200 includes a substrate 101, a pad 102, a conductive layer 104, a second passivation 105 and a conductive bump 106, which have similar configurations as described above or illustrated in any one of FIGS. 1-6.

In some embodiments, the semiconductor structure 200 includes a first passivation 103 disposed over the substrate 101. In some embodiments, the first passivation 103 includes a first dielectric layer 103c and a second dielectric layer 103d. In some embodiments, the first dielectric layer 103c is disposed over the substrate 101 and partially covers the pad 102. In some embodiments, the first dielectric layer 103c is disposed over a first surface 101a or a second surface 101b of the substrate 101. In some embodiments, the second dielectric layer 103d is disposed over the first dielectric layer 103c, partially covers the pad 102 and includes a protrusion 103b protruded from the second dielectric layer 103d and away from the first dielectric layer 103c. In some embodiments, the protrusion 103b is integral with or separates from the second dielectric layer 103d. In some embodiments, the conductive layer 104 is disposed over the second dielectric layer 103d. In some embodiments, the second passivation 105 is disposed over the second dielectric layer 103d.

In some embodiments, an opening 103e is disposed over the pad 102. In some embodiments, a portion of the pad 102 is exposed from the opening 103e extending through the second dielectric layer 103d and extending through at least a portion of the first dielectric layer 103c. In some embodiments, at least a portion of the conductive layer 104 is disposed over the pad 102 and within the opening 103e. In some embodiments, the conductive layer 104 is disposed over the second dielectric layer 103d. In some embodiments as shown in FIG. 8, the second passivation 105 includes a second opening 105a disposed over the opening 103e.

In some embodiments, the first dielectric layer 103c includes same material as or different material from the second dielectric layer 103d. In some embodiments, the first dielectric layer 103c includes oxide, nitride, polymer or the like. In some embodiments, the second dielectric layer 103d includes elastomer, epoxy, polyimide, polymer, resin, oxide or the like. In some embodiments, the second dielectric layer 103d includes elastic, deformable, flexible or soft material, such that the second dielectric layer 103d can provide flexibility or elasticity. In some embodiments, the second dielectric layer 103d is elastic, deformable or compressible.

Figure 8:
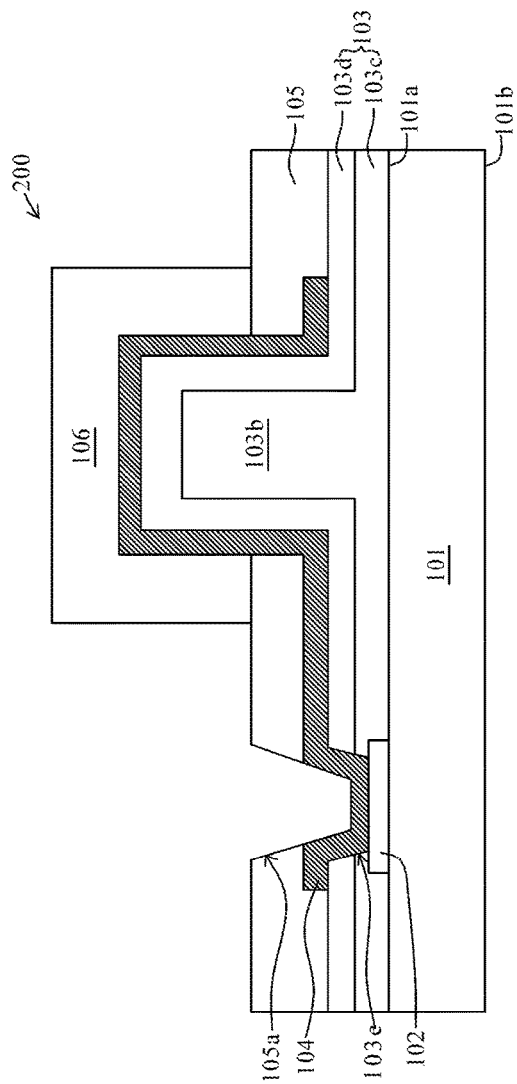
FIG. 8 is a schematic cross-sectional view of a semiconductor structure having a portion of a conductive layer exposed in accordance with some embodiments of the present disclosure.

In some embodiments as shown in FIG. 8 the first dielectric layer 103c includes the protrusion 103b protruded from the first dielectric layer 103c and away from the substrate 101. In some embodiments, the protrusion 103b is integral with or separates from the first dielectric layer 103c. In some embodiments, the second dielectric layer 103d is disposed over the first dielectric layer 103c and conformal to the protrusion 103b protruded from the first dielectric layer 103c.

Figure 9:
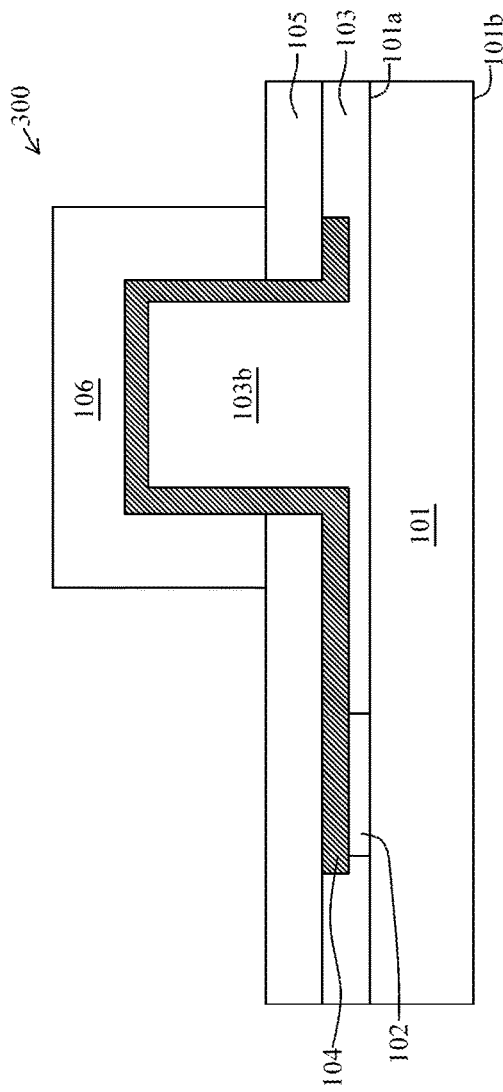
FIG. 9 is a schematic cross-sectional view of a semiconductor structure in accordance with some embodiments of the present disclosure.
Figure 10:
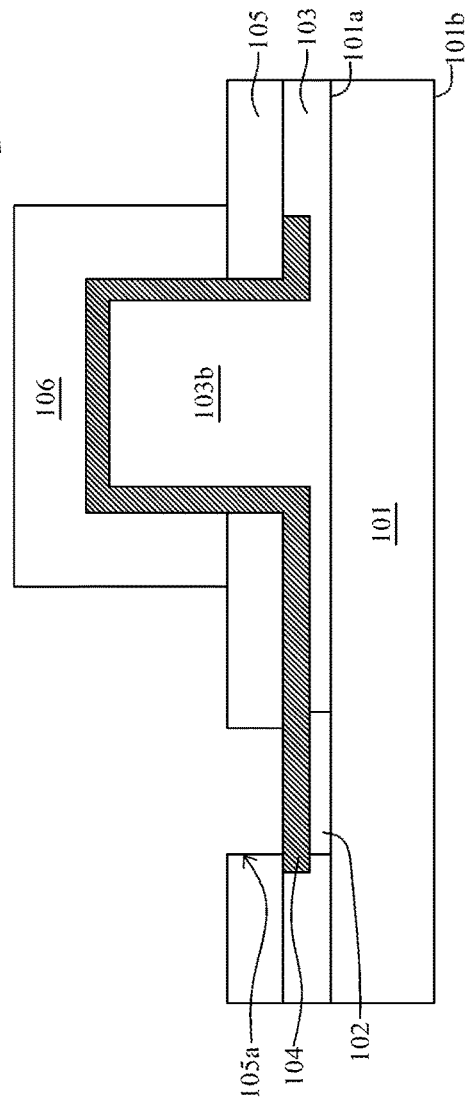
FIG. 10 is a schematic cross-sectional view of a semiconductor structure having a portion of a conductive layer exposed in accordance with some embodiments of the present disclosure.

FIGS. 9 and 10 are cross-sectional views of a semiconductor structure 300 in accordance with some embodiments of the present disclosure. In some embodiments, the semiconductor structure 300 has similar configuration as the semiconductor structure 100 or 200 described above or illustrated in any one of FIGS. 1-8.

Figure 11:
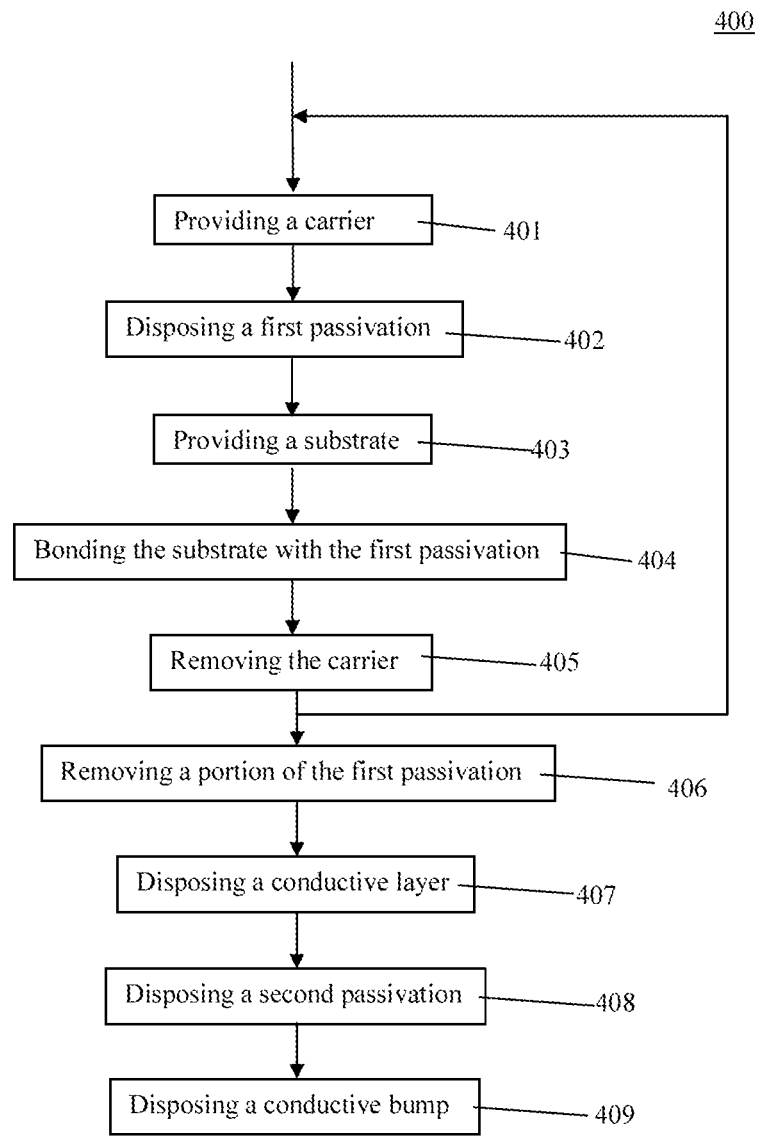
FIG. 11 is a flow chart of a method of manufacturing a semiconductor structure in accordance with some embodiments of the present disclosure.

In the present disclosure, a method of manufacturing a semiconductor structure 100 is also disclosed. In some embodiments, the semiconductor structure 100 can be formed by a method 400 of FIG. 11. The method 400 includes a number of operations and the description and illustration are not deemed as a limitation as the sequence of the operations. The method 400 includes a number of steps (401, 402, 403, 404, 405, 406, 407, 408 and 409).

Figure 12:
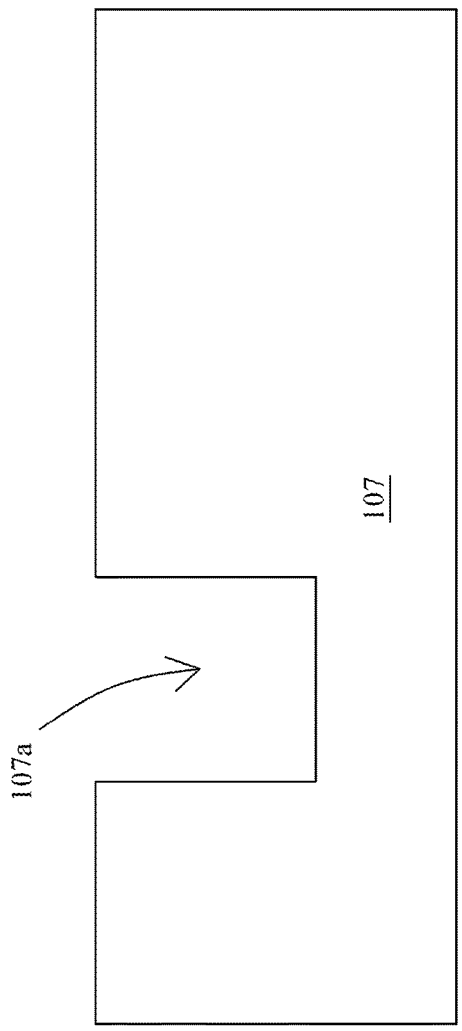

In step 401, a carrier 107 is provided or received as shown in FIG. 12. In some embodiments, the carrier 107 is made of semiconductive material. In some embodiments, the carrier 107 includes silicon, germanium, gallium, arsenic, and combinations thereof. In some embodiments, the carrier 107 is a semiconductive carrier or wafer. In some embodiments, the carrier 107 is a silicon carrier. In some embodiments, the carrier 107 is a mold. In some embodiments, the carrier 107 is in a quadrilateral, rectangular, square, polygonal or any other suitable shapes.

In some embodiments, the carrier 107 includes a recess 107a extending into the carrier 107. In some embodiments, the recess 107a is formed by removing a portion of the carrier 107. In some embodiments, the recess 107a can be formed by etching processes or other suitable processes.

Figure 13:
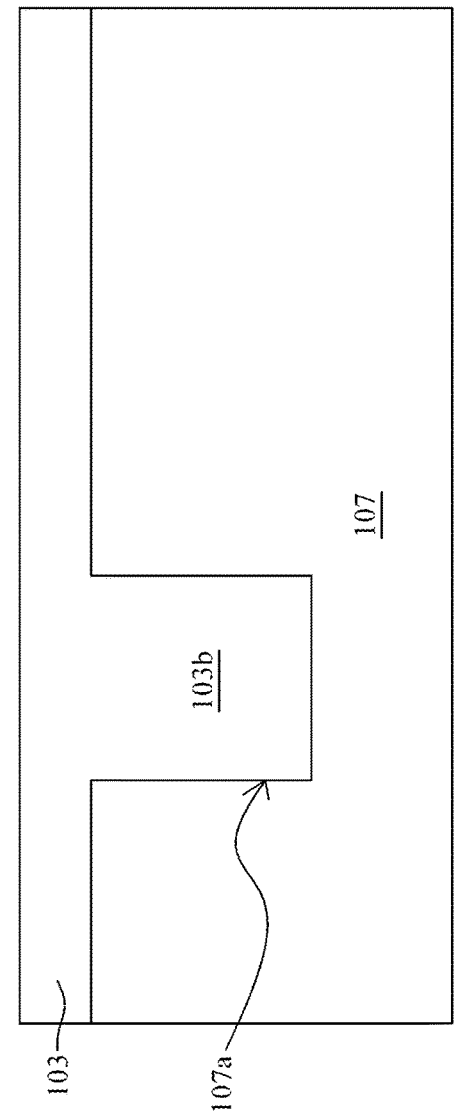

In step 402, a first passivation 103 is disposed over the carrier 107 as shown in FIG. 13. In some embodiments, the first passivation 103 is disposed over the carrier 107 and fills the recess 107a. In some embodiments, a protrusion 103b is formed within the recess 107a. In some embodiments, the protrusion 103b is surrounded by the carrier 107. In some embodiments, a release film is disposed over the carrier 107 and along the recess 107a prior to the disposing of the first passivation 103. In some embodiments, the release film is configured to facilitate a removal of the carrier 107 from the first passivation 103, and thus the first passivation 103 can be released from the carrier 107 later.

In some embodiments, the first passivation 103 is formed with dielectric materials such as elastomer, epoxy, polyimide, polymer, resin, oxide or the like. In some embodiments, the first passivation 103 includes elastic, deformable flexible or soft material, such that the first passivation 103 can provide flexibility or elasticity. In some embodiments, the first passivation 103 is elastic, deformable or compressible. In some embodiments, the first passivation 103 is disposed by chemical vapor deposition (CVD), plasma-enhanced chemical vapor deposition (PECVD), spin coating or any other suitable processes. In some embodiments, the first passivation 103 and the protrusion 103b have similar configurations as described above or illustrated in any one of FIGS. 1-10.

Figure 14:
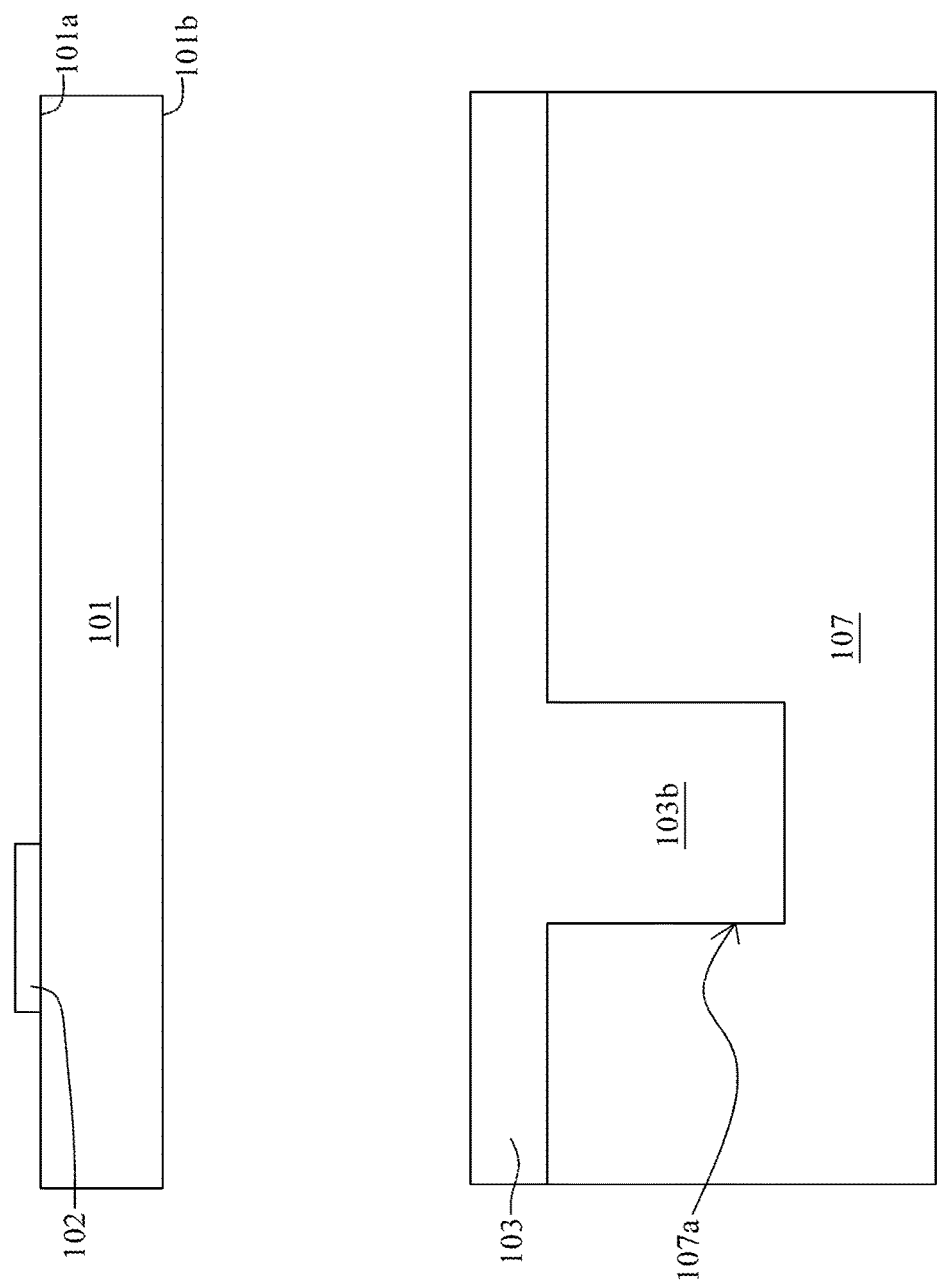

In step 403, a substrate 101 is provided or received as shown in FIG. 14. In some embodiments, the substrate 101 includes a first surface 101a and a second surface 101b opposite to the first surface 101a. In some embodiments, the substrate 101 includes several conductive lines and several electrical components, such as transistors and diodes, connected by the conductive lines. In some embodiments, the substrate 101 is a semiconductive substrate. In some embodiments, the substrate 101 includes silicon, germanium, gallium, arsenic, and combinations thereof. In some embodiments, the substrate 101 is a silicon substrate. In some embodiments, the substrate 101 is in a quadrilateral, rectangular, square, polygonal or any other suitable shapes. In some embodiments, the substrate 101 has similar configuration as described above or illustrated in any one of FIGS. 1-10.

Figure 15:
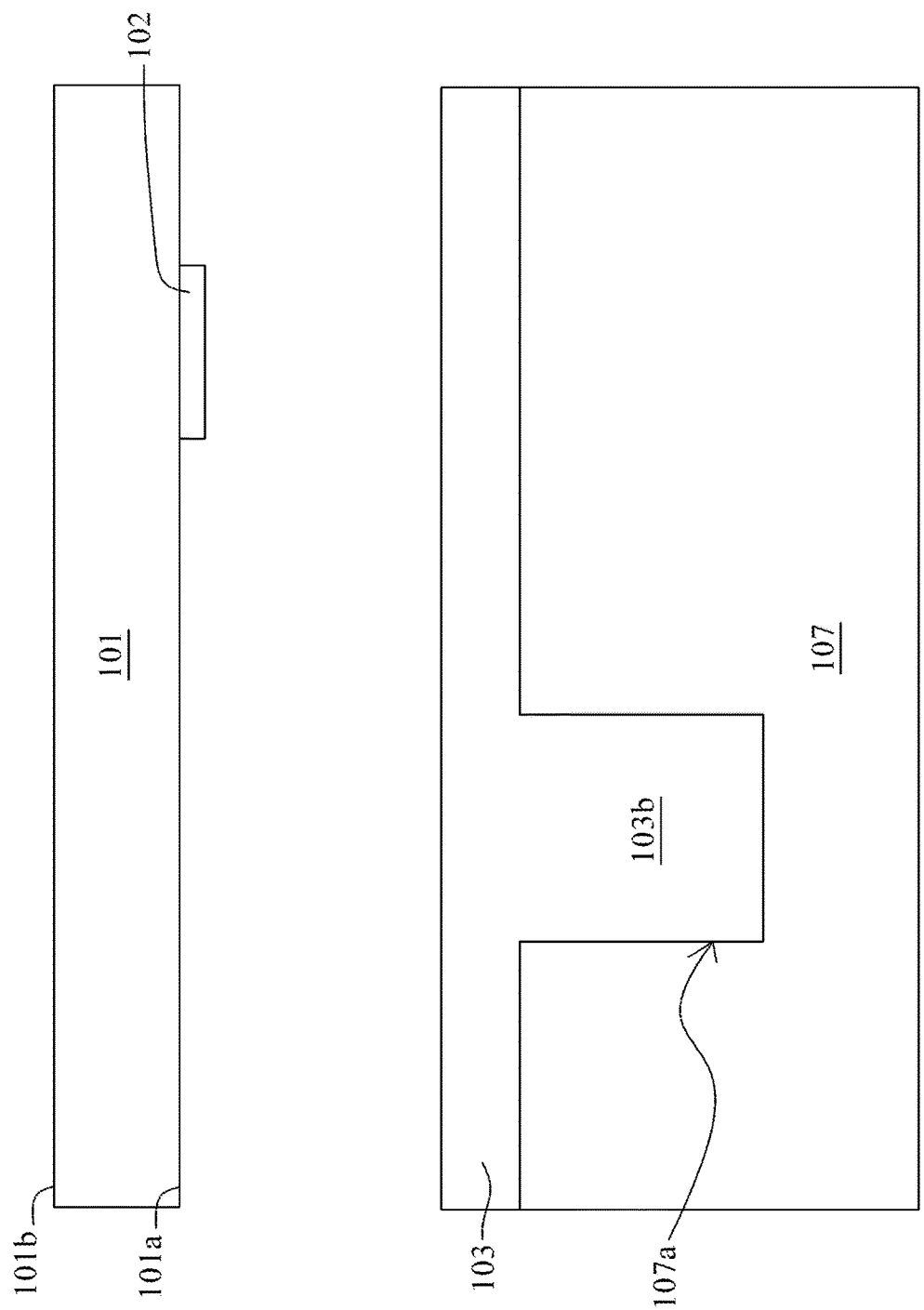

In some embodiments, the substrate 101 includes a pad 102 disposed thereon. In some embodiments, the pad 102 is disposed over the first surface 101a or the second surface 101b of the substrate 101. In some embodiments, the pad 102 is electrically connected to a circuitry in the substrate 101. In some embodiments, the pad 102 is configured to receive a conductive structure. In some embodiments, the pad 102 is a die pad or a bond pad. In some embodiments, the pad 102 includes gold, silver, copper, nickel, tungsten, aluminum, palladium and/or alloys thereof. In some embodiments, the pad 102 is formed by electroplating or any other suitable processes. In some embodiments, the pad 102 has similar configuration as described above or illustrated in any one of FIGS. 1-10. In some embodiments, the substrate 101 and the pad 102 are flipped as shown in FIG. 15 for subsequent processes.

Figure 16:
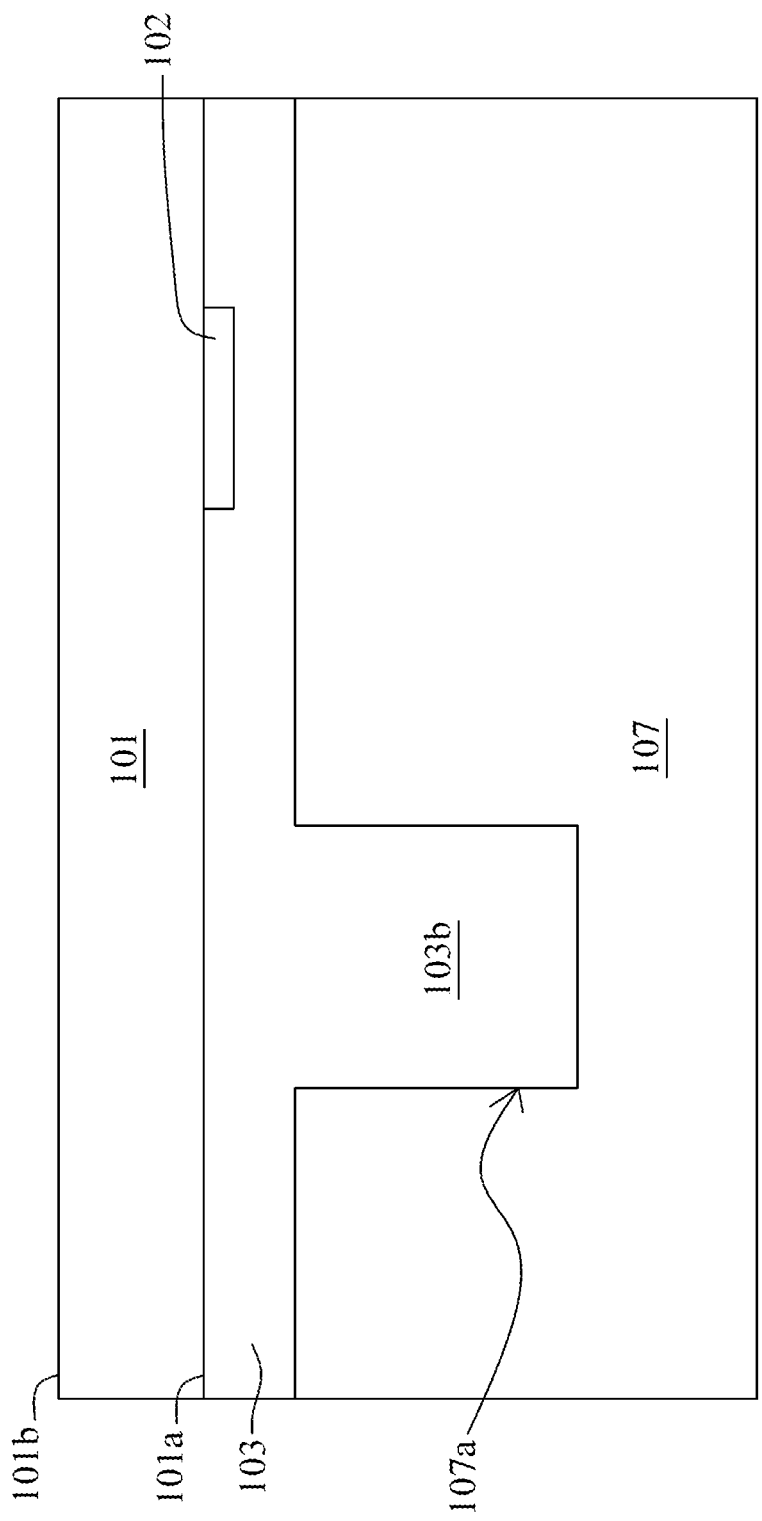

In step 404, the first passivation 103 is bonded with the substrate 101 as shown in FIG. 16. In some embodiments, the first surface 101a or the second surface 101b of the substrate 101 is disposed over and bonded with the first passivation 103, and the pad 102 is inserted into the first passivation 103. In some embodiments, the pad 102 is inserted into the first passivation 103 by pressing the substrate 101 towards the first passivation 103, applying a force over the substrate 101 towards the first passivation 103, pressing the carrier 107 towards the substrate 101, or applying a force over the carrier 107 towards the substrate 101. In some embodiments, the first passivation 103 is cured after the bonding of the substrate 101 with the first passivation 103 and insertion of the pad 102 into the first passivation 103. In some embodiments, the first passivation 103 is solidified by curing processes or other suitable processes such that the substrate 101 is bonded with the first passivation 103 and the pad 102 is encapsulated by the first passivation 103.

In step 405, the carrier 107 is removed as shown in FIG. 17 or 18. In some embodiments, the carrier 107 is removed from the first passivation 103 such that the first passivation 103 is released from the carrier 107. In some embodiments, the substrate 101 bonded with the first passivation 103 is flipped prior to or after the removal of the carrier 107. In some embodiments, the carrier 107 is reusable such that the carrier 107 can be used again after the removal. In some embodiments, the carrier 107 can be used again, for example, by repeatedly implementing the steps 301-305 to manufacture an intermediate structure as shown in FIG. 17 or 18. In some embodiments, the protrusion 103b and the first passivation 103 are integrally formed. In some embodiments, the protrusion 103b is protruded from the first passivation 103 and away from the substrate 101.

In step 406, a portion of the first passivation 103 is removed to expose a portion of the pad 102 as shown in FIG. 19. In some embodiments, the portion of the first passivation 103 disposed over the portion of the pad 102 is removed to form a first opening 103a. In some embodiments, the portion of the first passivation 103 is removed by photolithography and etching processes or any other suitable processes. In some embodiments, the portion of the pad 102 is exposed from the first passivation 103. In some embodiments, the first opening 103a has similar configuration as described above or illustrated in any one of FIGS. 1-10.

In step 407, a conductive layer 104 is disposed over the first passivation 103 as shown in FIG. 20. In some embodiments, the conductive layer 104 is disposed over the portion of the pad 102 exposed from the first passivation 103. In some embodiments, the conductive layer 104 is disposed conformal to an outer surface of the protrusion 103b and a sidewall of the first opening 103a. In some embodiments, the conductive layer 104 is electrically connected with the pad 102. In some embodiments, the conductive layer 104 is formed by disposing a photoresist (PR) over the first passivation 103, removing a portion of the PR so as to pattern the PR, disposing a conductive material within the removed portion of the PR, and then removing the PR. In some embodiments, the conductive material is disposed by plating, electroplating or any other suitable processes. In some embodiments, the PR is patterned by photolithography, etching or any other suitable processes. In some embodiments, the PR is wholly removed by etching, stripping or any other suitable processes. In some embodiments, the conductive layer 104 has similar configuration as described above or illustrated in any one of FIGS. 1-8.

Figure 21:
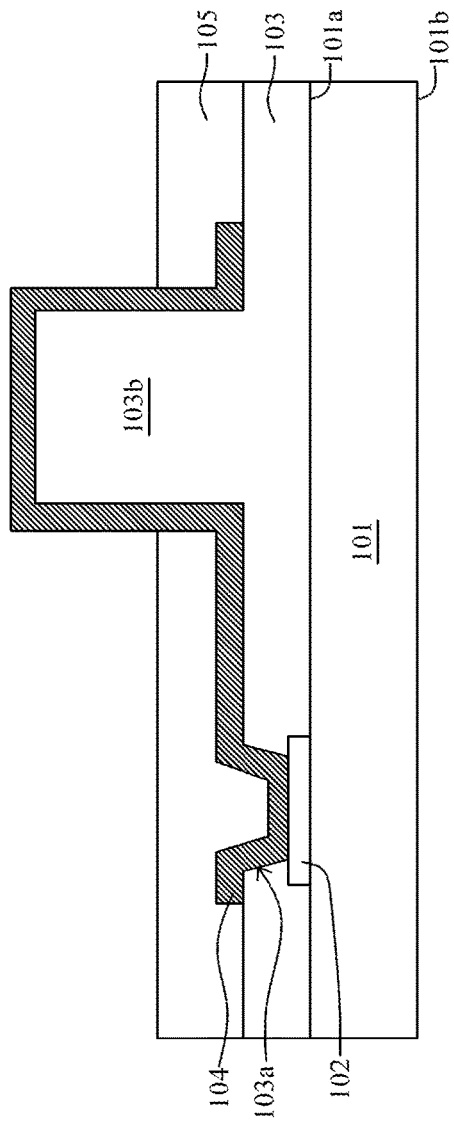

In step 408, a second passivation 105 is disposed over the conductive layer 104 as shown in FIG. 21. In some embodiments, the second passivation 105 partially covers the conductive layer 104. In some embodiments, the conductive layer 104 disposed over the protrusion 103b is protruded or exposed from the second passivation 105. In some embodiments, the second passivation 105 is disposed by CVD, PECVD, spin coating or any other suitable processes. In some embodiments, the second passivation 105 includes same material as or different material from the first passivation 103. In some embodiments, the second passivation 105 includes dielectric materials, such as oxide, nitride, polymer or the like. In some embodiments, the second passivation 105 has similar configuration as described above or illustrated in any one of FIGS. 1-10.

Figure 22:
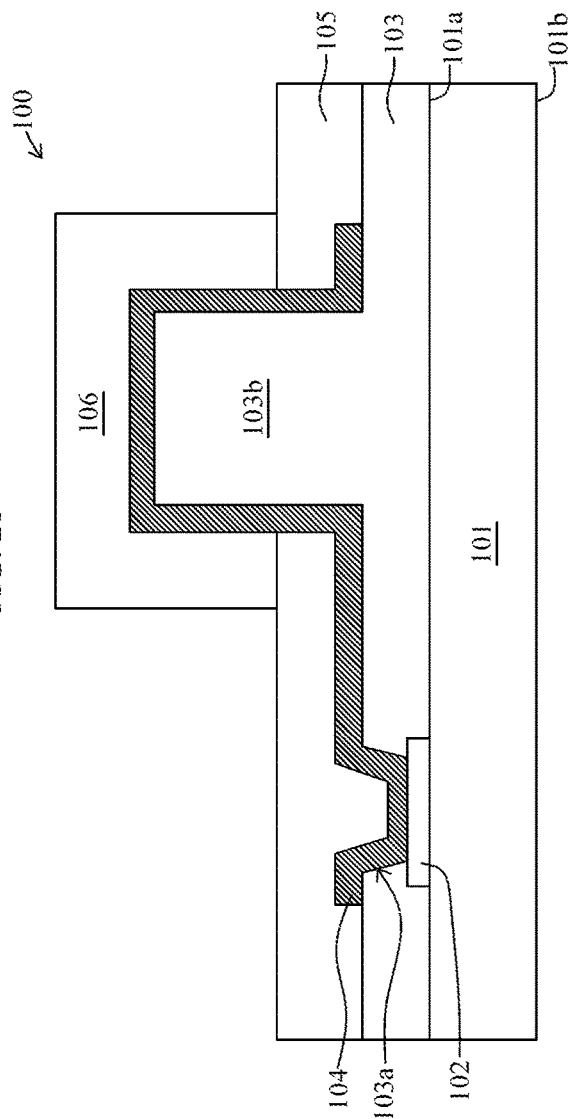

In step 409, a conductive bump 106 is disposed over the conductive layer 104 exposed from the second passivation 105 as shown in FIG. 22. In some embodiments, the conductive bump 106 is disposed over or surrounds the protrusion 103b and a portion of the conductive layer 104. In some embodiments, the conductive bump 106 is electrically connected to the pad 102 through the conductive layer 104. In some embodiments, the protrusion 103b is protruded into the conductive bump 106. In some embodiments, the conductive bump 106 is formed by stencil pasting, ball dropping, reflowing, curing or any other suitable processes. In some embodiments, the conductive bump 106 is a solder joint, a solder bump, a solder ball, a ball grid array (BGA) ball or the like. In some embodiments, the conductive bump 106 is a conductive pillar or post. In some embodiments, the conductive bump 106 includes lead, tin, copper, gold, silver, nickel or combination thereof.

Figure 23:
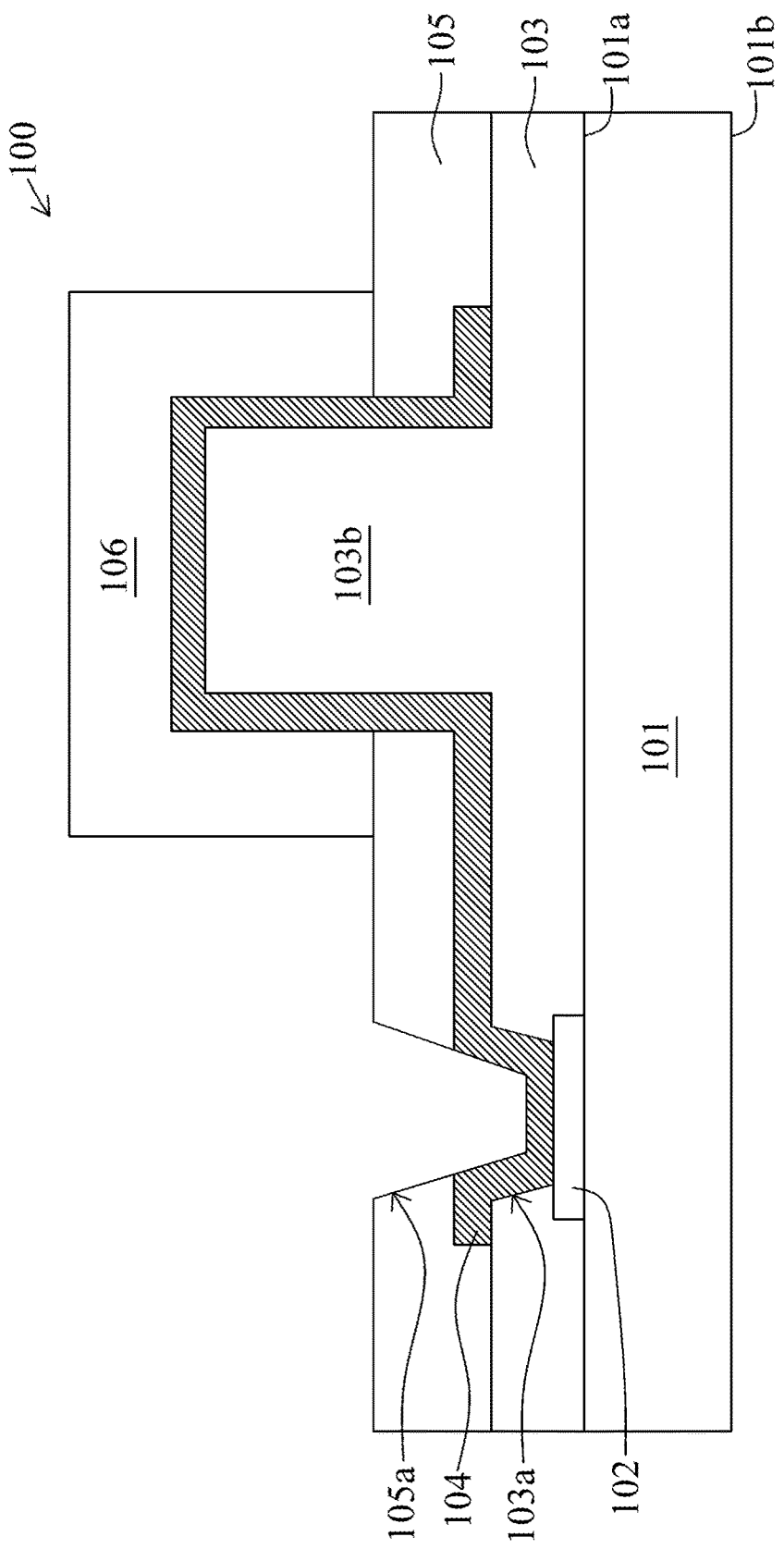

In some embodiments, a portion of the second passivation 105 is removed to form a second opening 105a as shown in FIG. 23. In some embodiments, the semiconductor structure 100 is formed, which has similar configuration as described above or illustrated in any one of FIGS. 1-6. In some embodiments, the protrusion 103b or the first passivation 103 is configured to absorb a force during disposing or formation of the conductive bump 106. In some embodiments, the steps 401-405 can be implemented in parallel to the steps 406-409.

Figure 24:
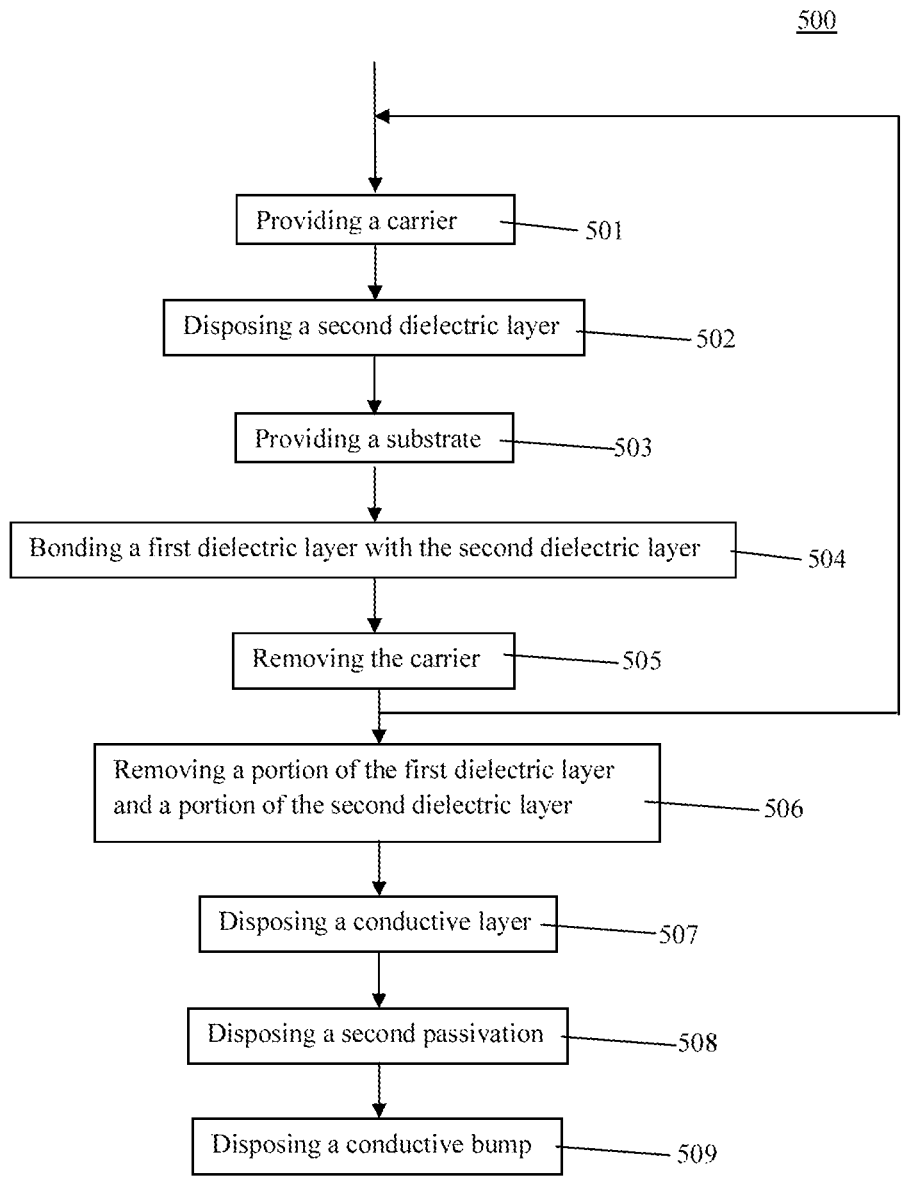
FIG. 24 is a flow chart of a method of manufacturing a semiconductor structure in accordance with some embodiments of the present disclosure.

In some embodiments, the semiconductor structure 200 can be formed by a method 500 of FIG. 24. The method 500 includes a number of operations and the description and illustration are not deemed as a limitation as the sequence of the operations. The method 500 includes a number of steps (501, 502, 503, 504, 505, 506, 507, 508 and 509).

In step 501, a carrier 107 including a recess 107a is provided or received as shown in FIG. 25. In some embodiments, the step 501 is similar to the step 401.

In step 502, a second dielectric layer 103d is disposed over the carrier 107 and fills the recess 107a as shown in FIG. 26. In some embodiments, a protrusion 103b is formed within the recess 107. In some embodiments, the protrusion 103b is integrally formed with the second dielectric layer 103d. In some embodiments, the second dielectric layer 103d includes elastomer, polyimide, polymer, resin, epoxy or the like. In some embodiments, the second dielectric layer 103d is disposed by CVD, spin coating or any other suitable processes. In some embodiments, the second dielectric layer 103d has similar configuration as described above or illustrated in FIG. 7 or 8. In some embodiments, a release film is disposed over the carrier 107 and along the recess 107a. In some embodiments, the release film is configured to facilitate a removal of the carrier 107 from the second dielectric layer 103d, and thus the second dielectric layer 103d can be released from the carrier 107 later.

Figure 27:
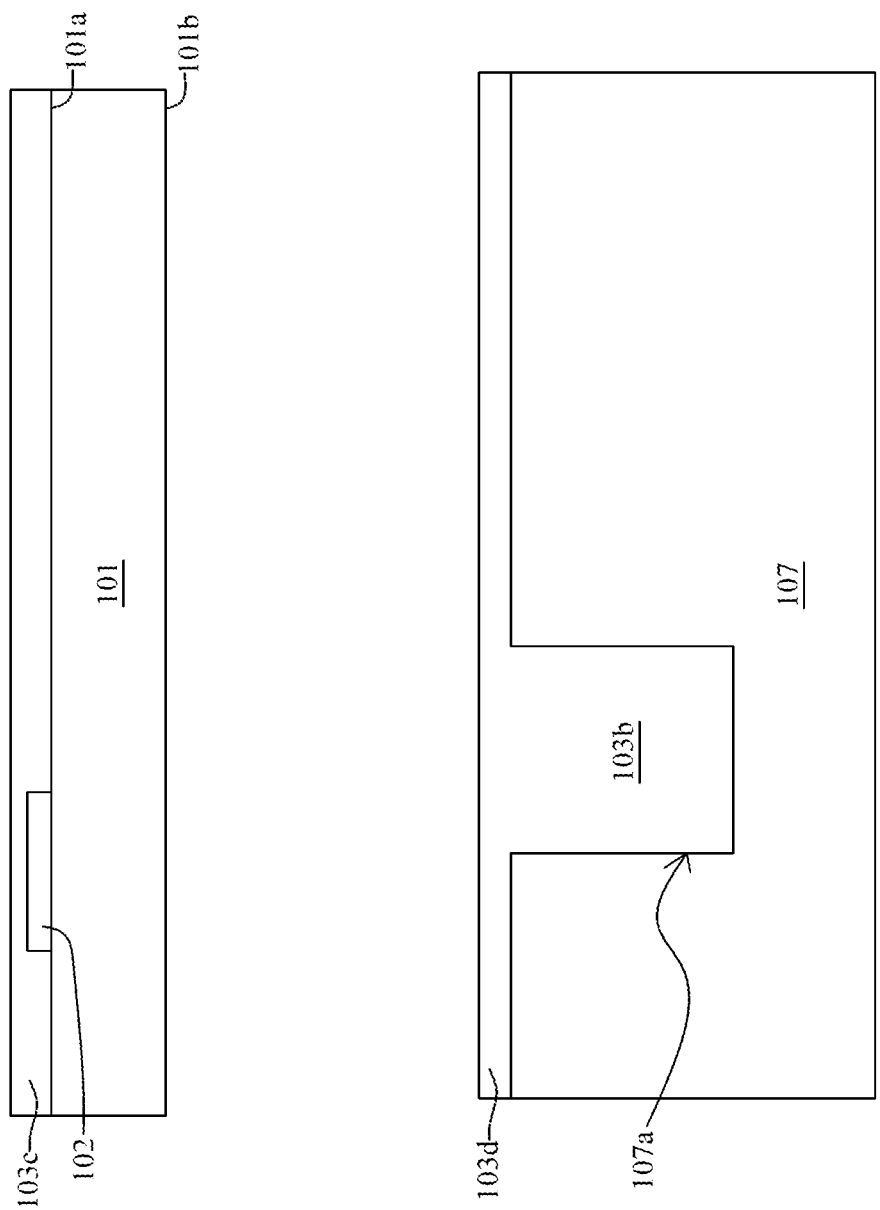
Figure 28:
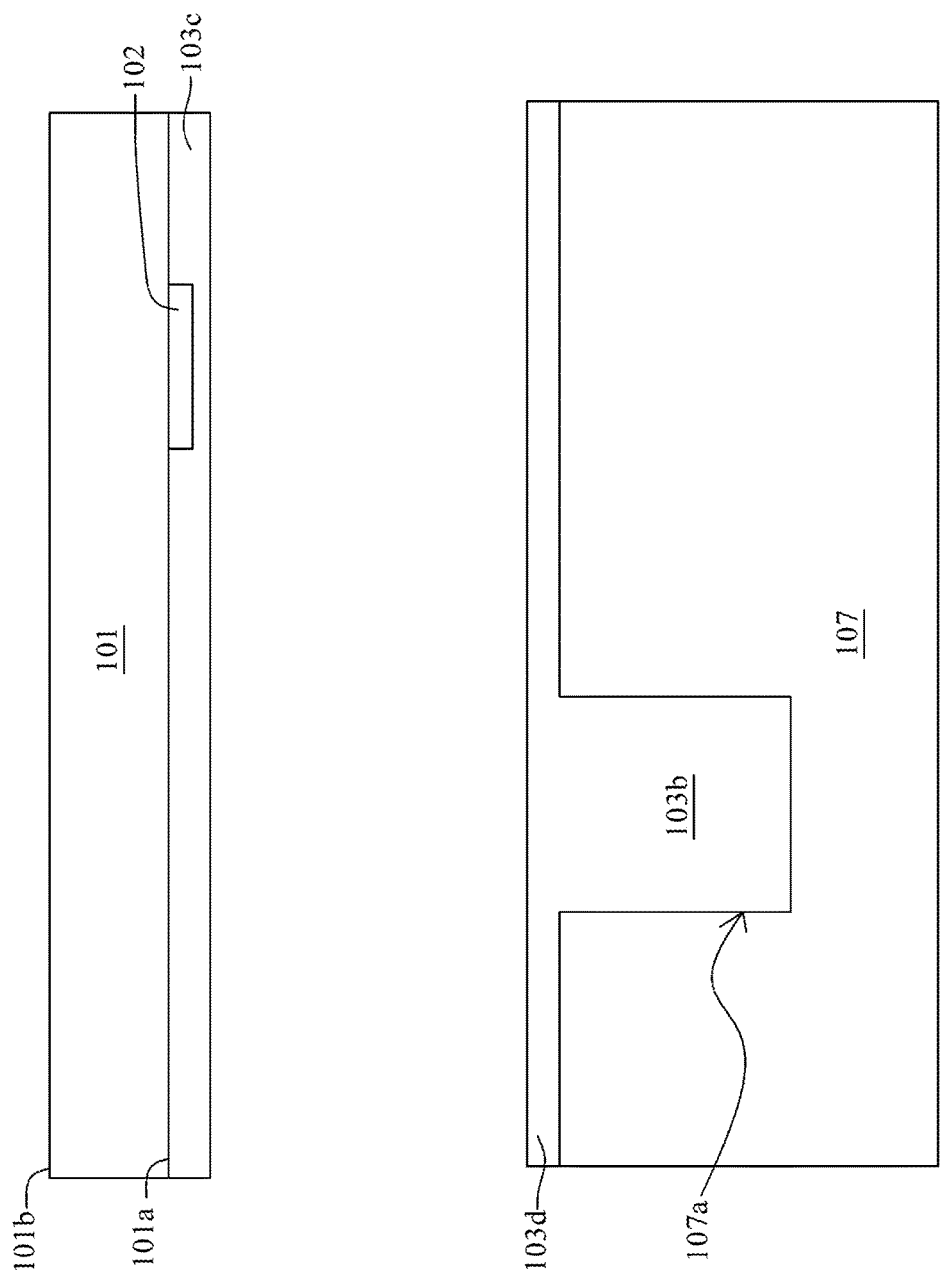

In step 503, a substrate 101 is provided or received as shown in FIG. 27. In some embodiments, the substrate 101 includes a pad 102 disposed over the substrate 101 and a first dielectric layer 103c disposed over the substrate 101 and covering the pad 102. In some embodiments, the first dielectric layer 103c includes oxide, nitride, polymer or the like. In some embodiments, the first dielectric layer 103c includes same material as or different material from the second dielectric layer 103d. In some embodiments, the first dielectric layer 103c is disposed by CVD, spin coating or any other suitable processes. In some embodiments, the substrate 101 including the pad 102 and the first dielectric layer 103c is flipped as shown in FIG. 28. In some embodiments, the first dielectric layer 103c has similar configuration as described above or illustrated in FIG. 7 or 8.

Figure 29:
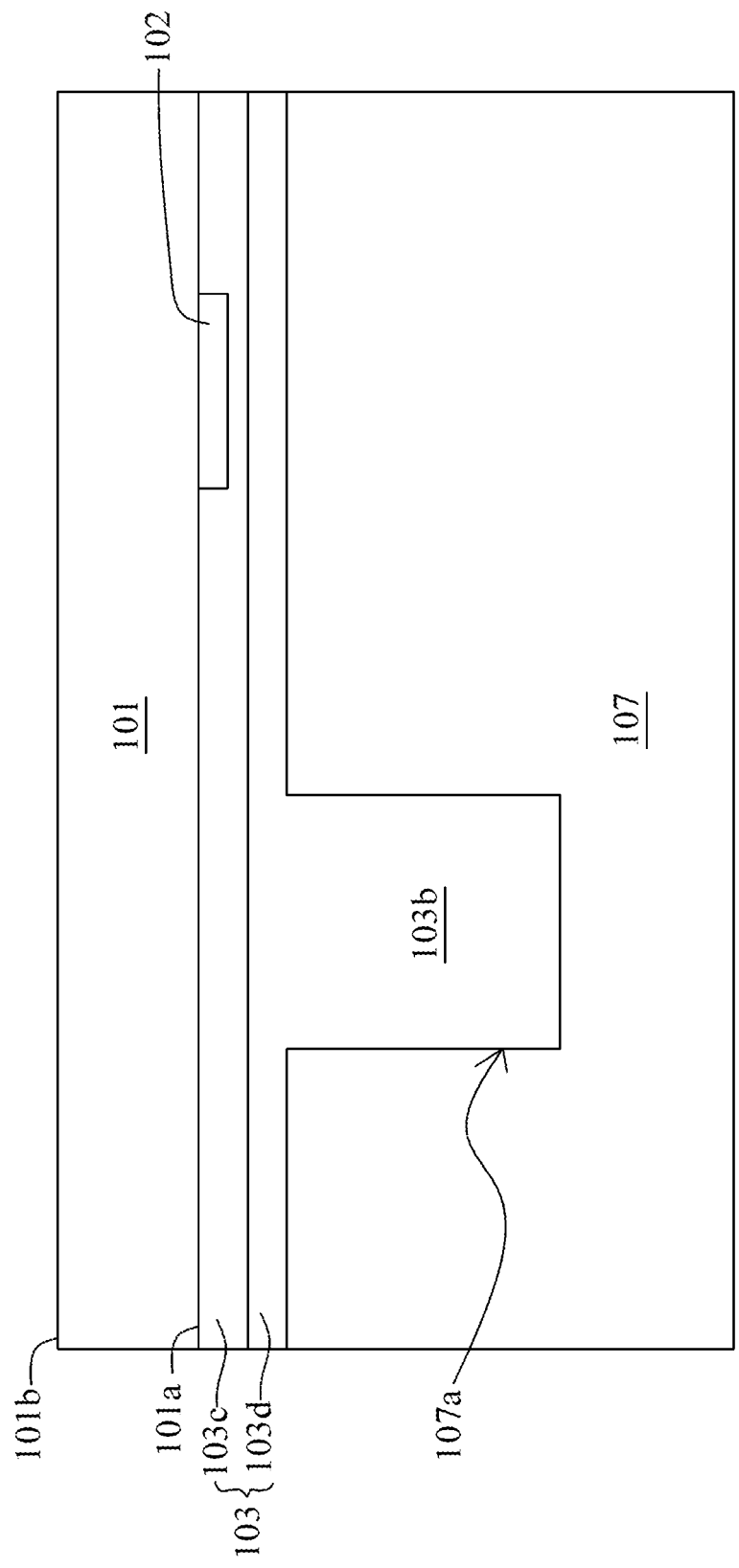

In step 504, the first dielectric layer 103c is bonded with the second dielectric layer 103d as shown in FIG. 29. In some embodiments, the first dielectric layer 103c is disposed over the second dielectric layer 103d, and then the first dielectric layer 103c and the second dielectric layer 103d are solidified by curing processes or other suitable processes such that the first dielectric layer 103c is bonded with the second dielectric layer 103d. In some embodiments, a first passivation 103 including the first dielectric layer 103c and the second dielectric layer 103d is formed. In some embodiments, the first passivation 103 has similar configuration as described above or illustrated in any one of FIGS. 1-10.

Figure 30:
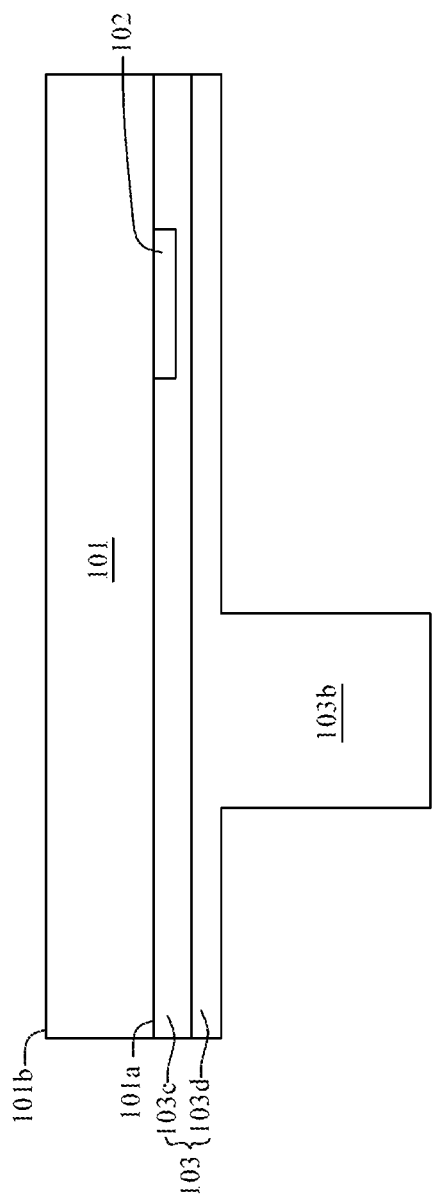
Figure 31:
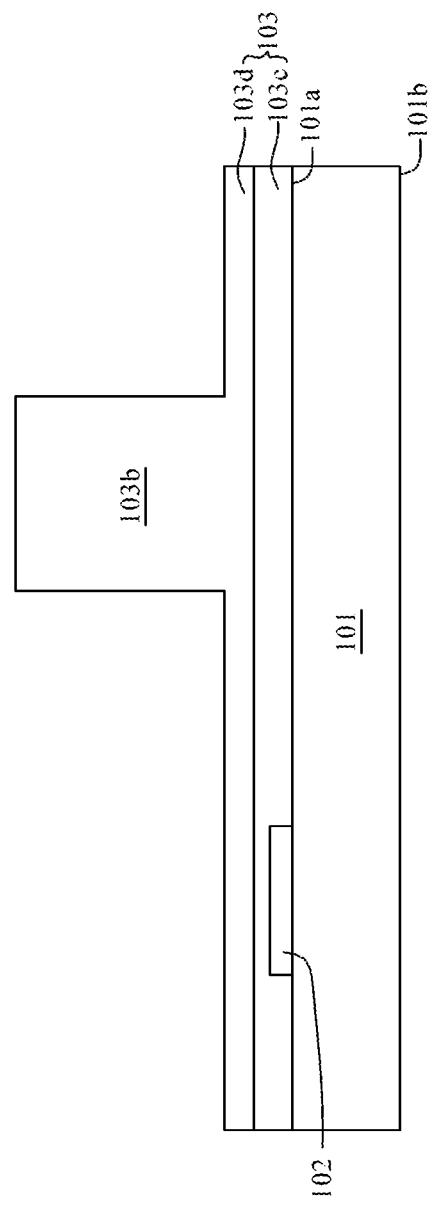

In step 505, the carrier 107 is removed as shown in FIG. 30 or 31. In some embodiments, the carrier 107 is removed from the second dielectric layer 103d such that the second dielectric layer 103d is released from the carrier 107. In some embodiments, the substrate 101, the pad 102, the first dielectric layer 103c and the second dielectric layer 103d bonded with the first dielectric layer 103c are flipped prior to or after the removal of the carrier 107. In some embodiments, the carrier 107 is reusable such that the carrier 107 can be used again after the removal. In some embodiments, the step 505 is similar to the step 405.

In step 506, a portion of the first dielectric layer 103c and a portion of the second dielectric layer 103d are removed to expose a portion of the pad 102 as shown in FIG. 32. In some embodiments, an opening 103e is formed to expose the portion of the pad 102. In some embodiments, the portion of the first dielectric layer 103c and the portion of the second dielectric layer 103d disposed over the pad 102 are removed by photolithography and etching processes or any other suitable processes. In some embodiments, the opening 103e has similar configuration as described above or illustrated in FIG. 7 or 8.

In step 507, a conductive layer 104 is disposed over the second dielectric layer 103d as shown in FIG. 33. In some embodiments, the conductive layer 104 is disposed over the portion of the pad 102 exposed from the first dielectric layer 103c and the second dielectric layer 103d. In some embodiments, the conductive layer 104 is disposed conformal to an outer surface of the protrusion 103b and a sidewall of the opening 103e. In some embodiments, the conductive layer 104 is electrically connected with the pad 102. In some embodiments, the step 407 is similar to the step 307.

Figure 34:
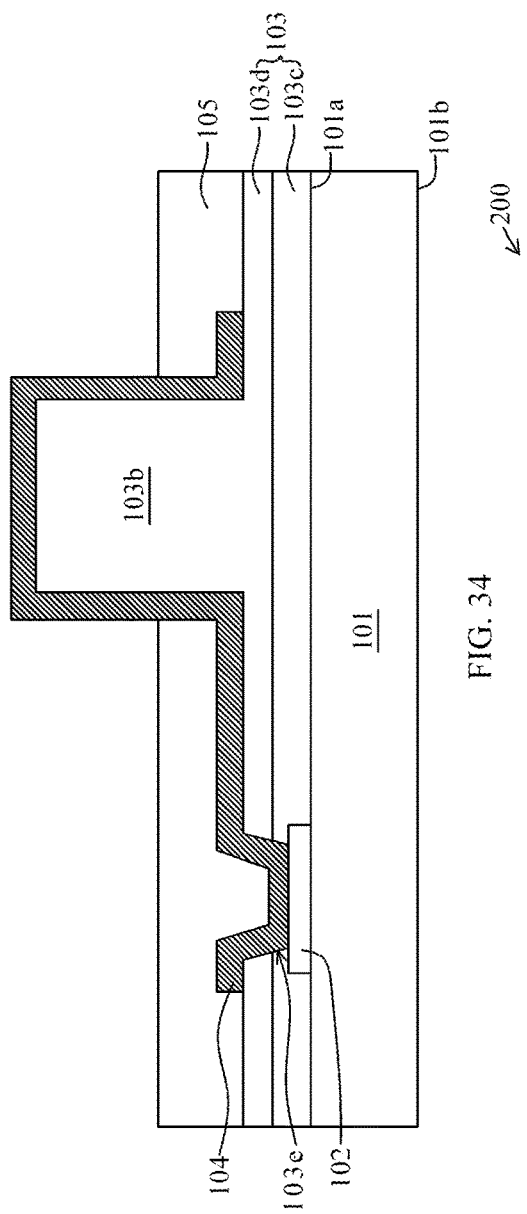

In step 508, a second passivation 105 is disposed over the second dielectric layer 103d and covers a portion of the conductive layer 104 as shown in FIG. 34. In some embodiments, the conductive layer 104 disposed over the protrusion 103b is protruded or exposed from the second passivation 105. In some embodiments, the step 508 is similar to the step 408.

Figure 35:
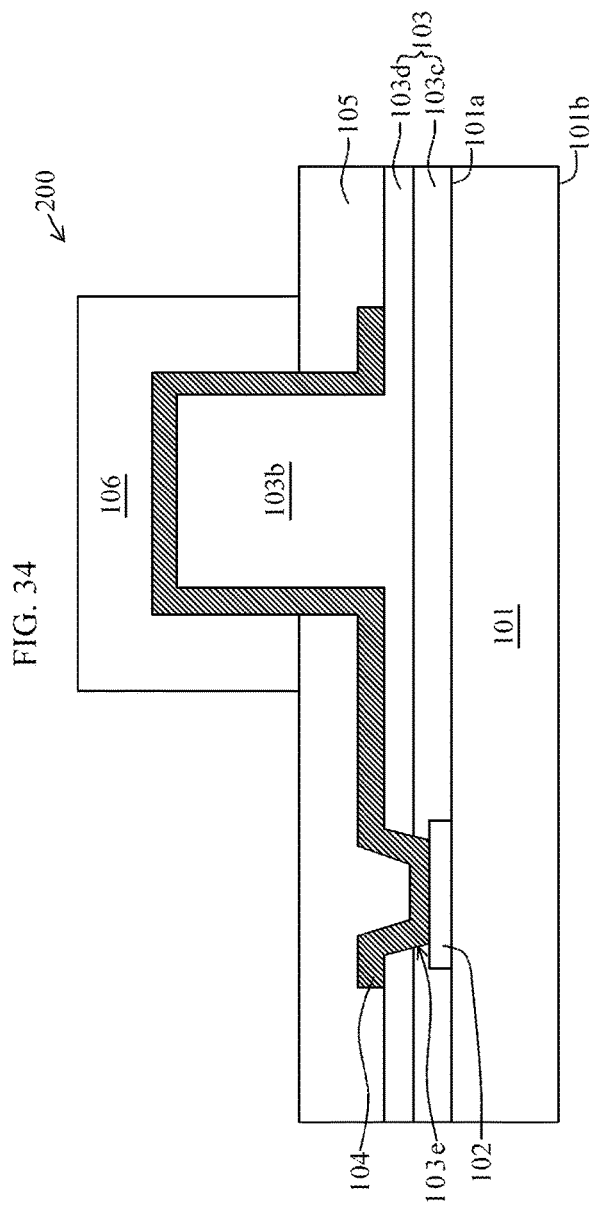
Figure 36:
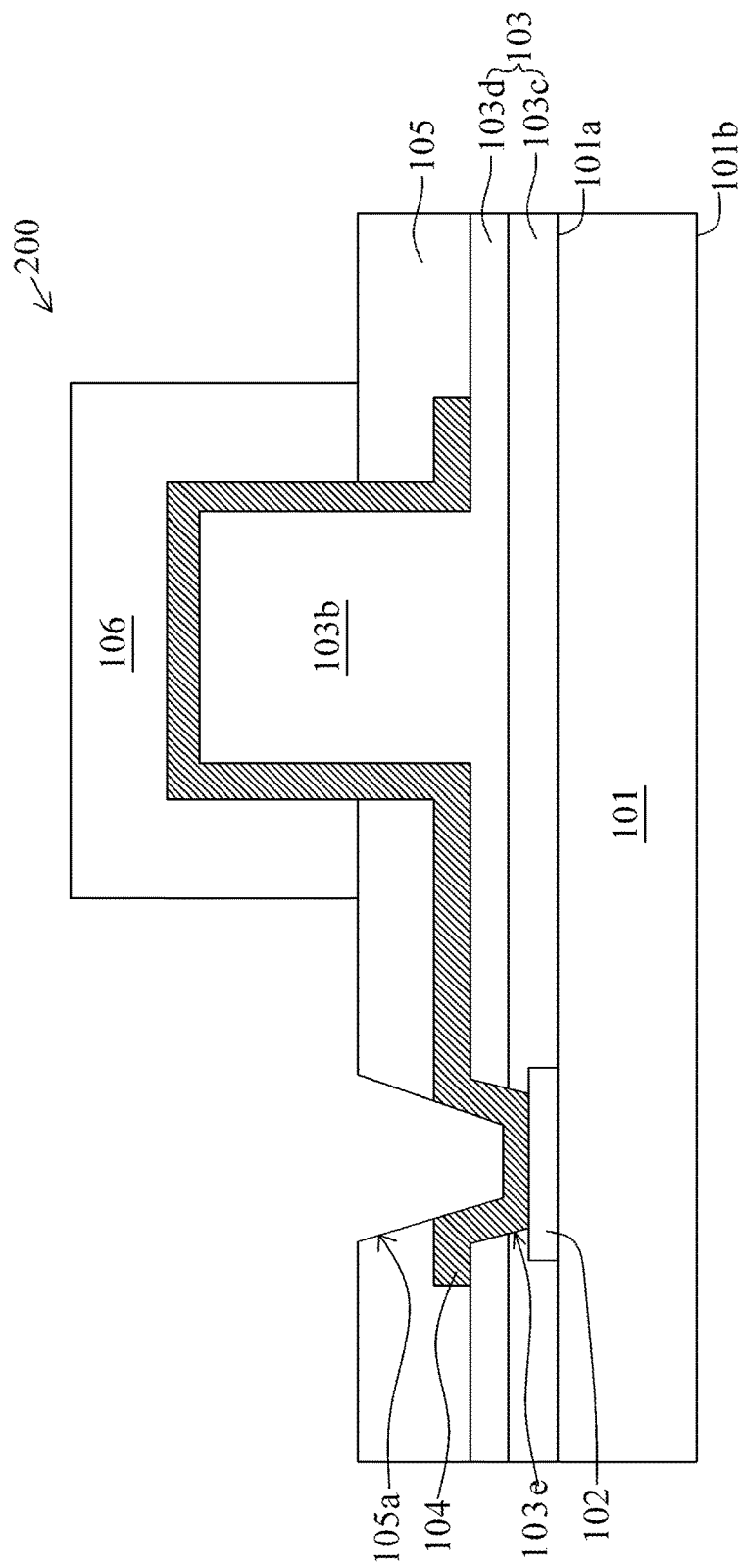

In step 509, a conductive bump 106 is disposed over the protrusion 103b and covers a portion of the conductive layer 104 exposed from the second passivation 105 as shown in FIG. 35 or 36. In some embodiments, the step 509 is similar to the step 409. In some embodiments, a semiconductor structure 200 is formed, which has similar configuration as described above or illustrated in FIG. 7 or 8.

Figure 37:
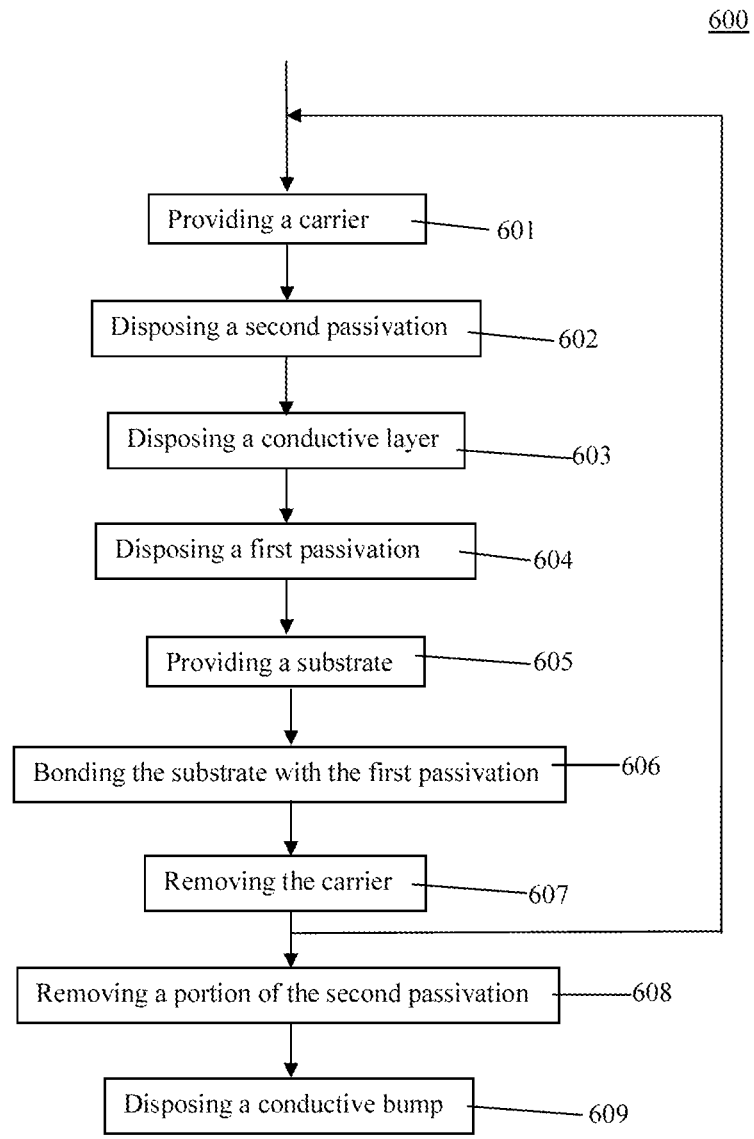
FIG. 37 is a flow chart of a method of manufacturing a semiconductor structure in accordance with some embodiments of the present disclosure.

In some embodiments, the semiconductor structure 300 can be formed by a method 600 of FIG. 37. The method 600 includes a number of operations and the description and illustration are not deemed as a limitation as the sequence of the operations. The method 600 includes a number of steps (601, 602, 603, 604, 605, 606, 607, 608 and 609).

Figure 38:
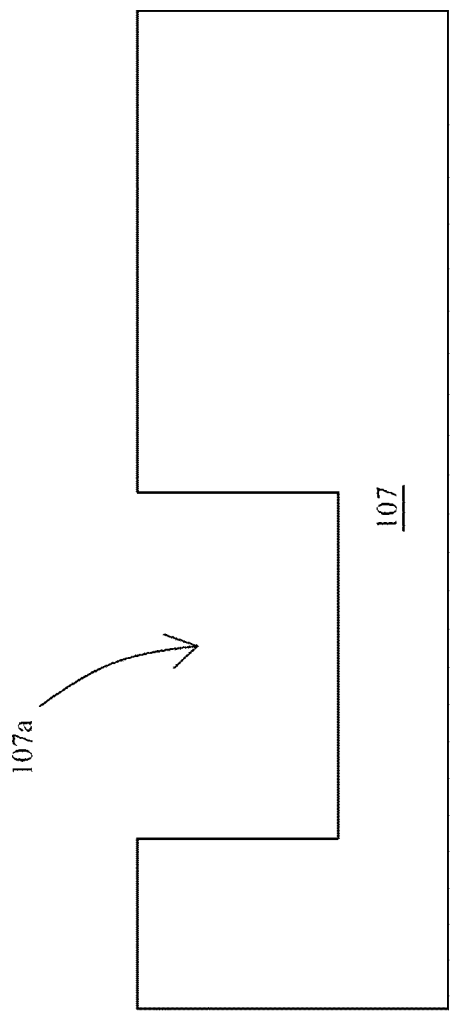
FIGS. 38-49 are schematic views of manufacturing the semiconductor structure by the method of FIG. 37 in accordance with some embodiments of the present disclosure.

In step 601, a carrier 107 including a recess 107a is provided or received as shown in FIG. 38. In some embodiments, the step 601 is similar to the step 401 or the step 501.

Figure 39:
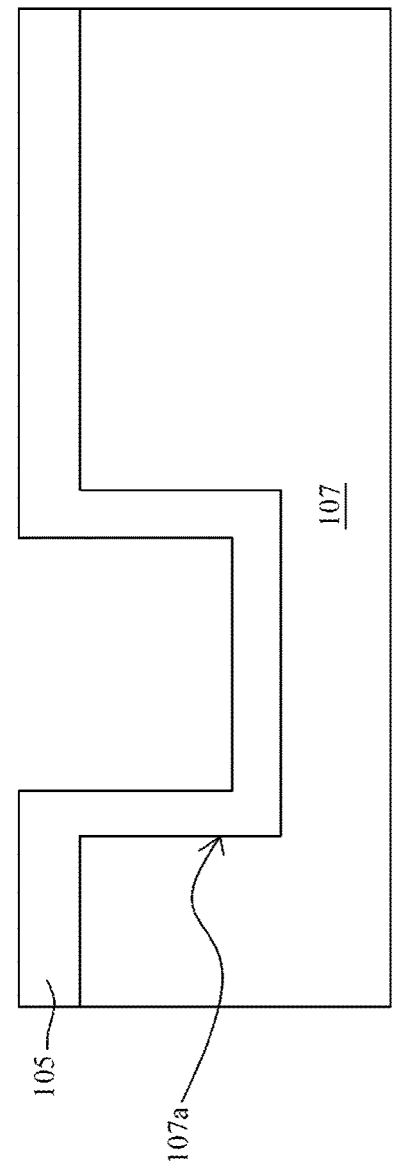

In step 602, a second passivation 105 is disposed over the carrier 107 and the recess 107a as shown in FIG. 39. In some embodiments, the second passivation 105 is disposed conformal to a surface of the carrier 107 and a sidewall of the recess 107a. In some embodiments, the second passivation 105 is disposed by CVD, spin coating or any other suitable processes. In some embodiments, the second passivation 105 has similar configuration as described above or illustrated in any one of FIGS. 1-10.

In some embodiments, a release film is disposed over the carrier 107 and along the recess 107a prior to the disposing of the second passivation 105. In some embodiments, the release film is configured to facilitate a removal of the carrier 107 from the second passivation 105, and thus the second passivation 105 can be released from the carrier 107 later.

Figure 40:
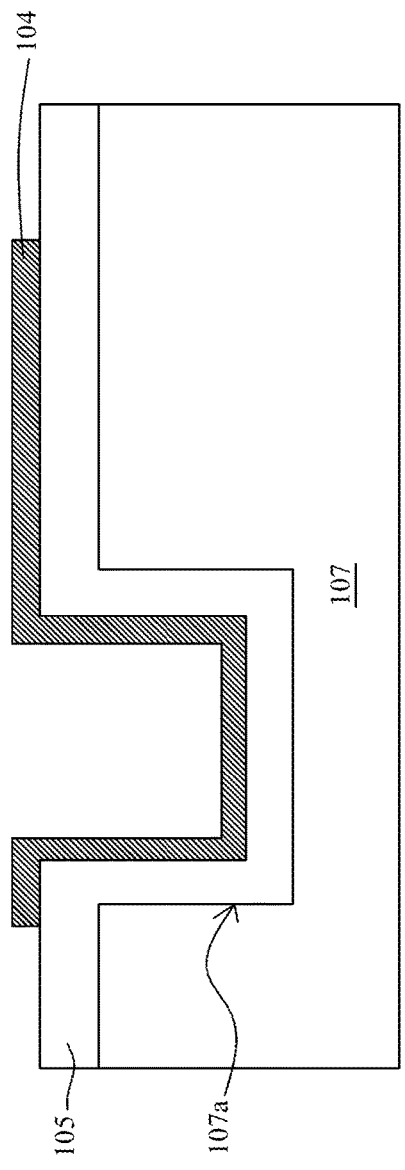

In step 603, a conductive layer 104 is disposed over the second passivation 105 as shown in FIG. 40. In some embodiments, the conductive layer 104 is disposed conformal to the second passivation 105. In some embodiments, a portion of the conductive layer 104 is disposed within the recess 107a. In some embodiments, the conductive layer 104 is disposed by plating, electroplating or any other suitable processes. In some embodiments, the conductive layer 104 has similar configuration as described above or illustrated in any one of FIGS. 1-10.

Figure 41:
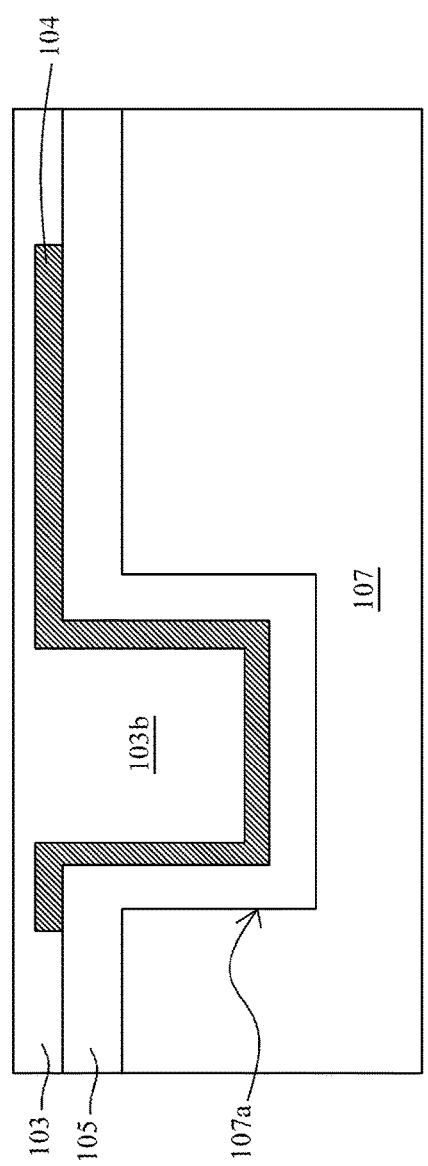

In step 604, a first passivation 103 is disposed over the conductive layer 104 and the second passivation 103 as shown in FIG. 41. In some embodiments, the first passivation 103 covers the conductive layer 104. In some embodiments, a portion of the first passivation 103 is disposed within the recess 107a to form a protrusion 103b. In some embodiments, the protrusion 103b is integrally formed with the first passivation 103. In some embodiments, the first passivation 103 is disposed by CVD, spin coating or any other suitable operations. In some embodiments, the first passivation 103 has similar configuration as described above or illustrated in any one of FIGS. 1-10.

Figure 42:
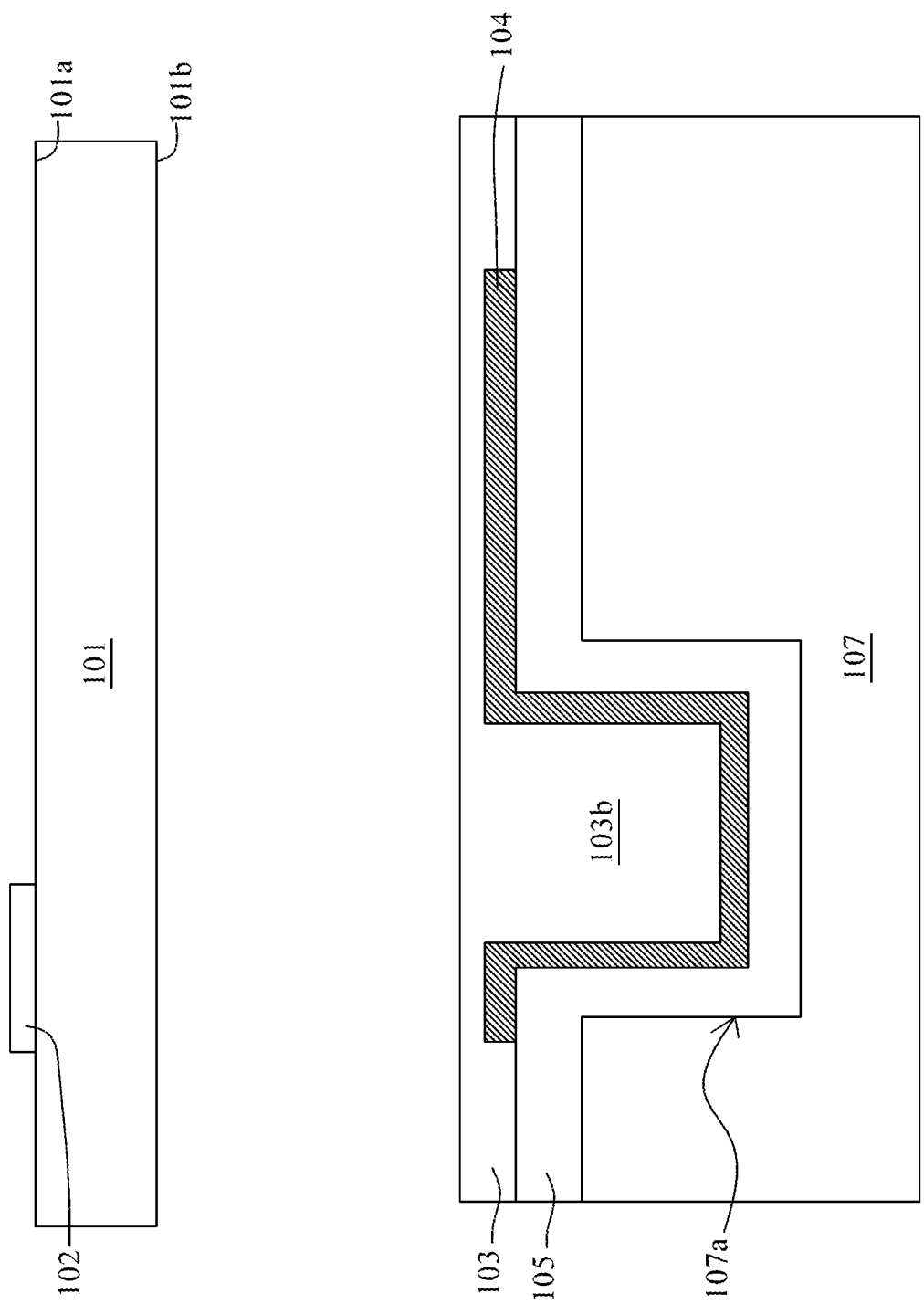
Figure 43:
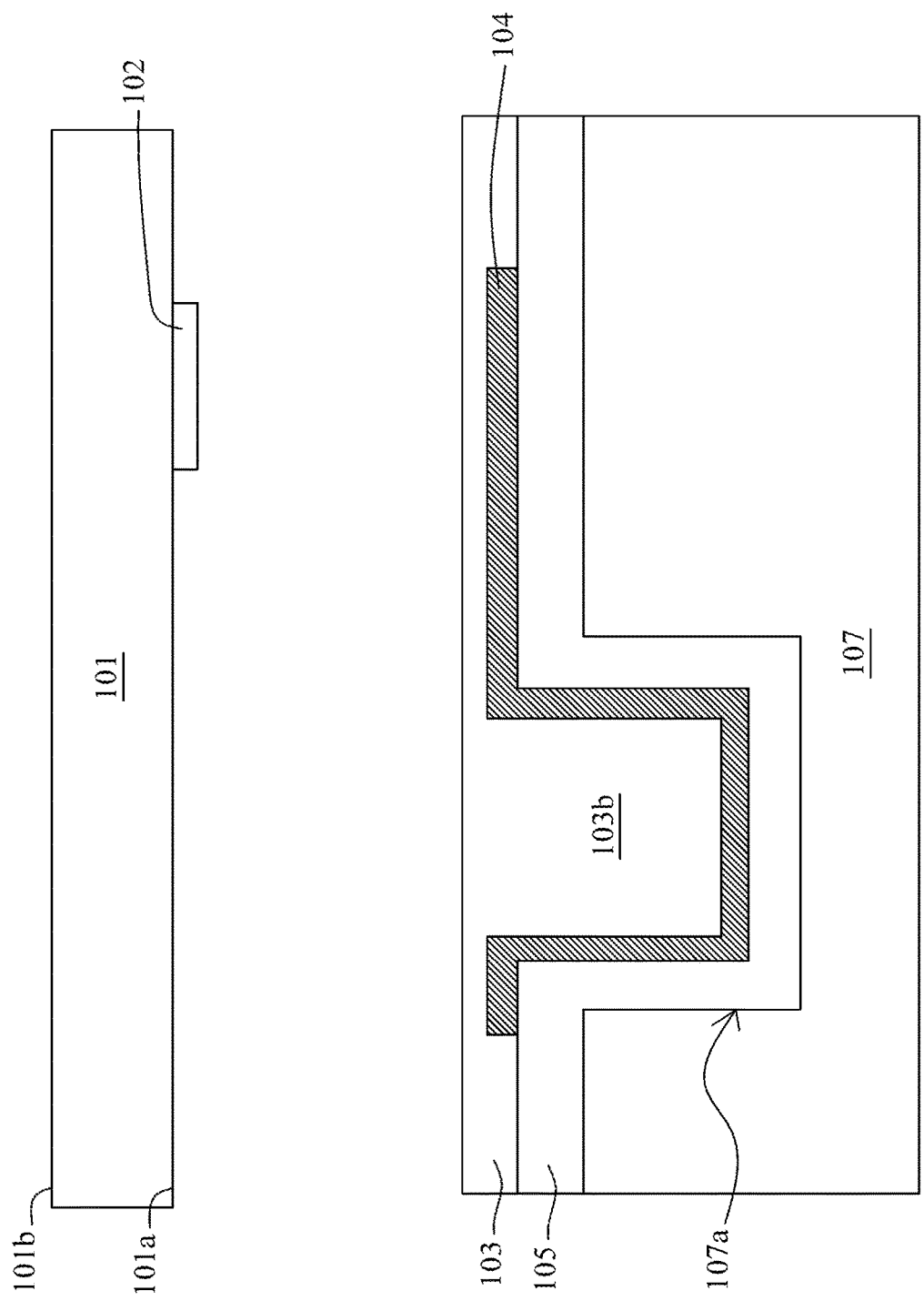

In step 605, a substrate 101 including a pad 102 is provided or received as shown in FIG. 42. In some embodiments, the step 605 is similar to the step 403. In some embodiments, the substrate 101 and the pad 102 are flipped as shown in FIG. 43.

Figure 44:
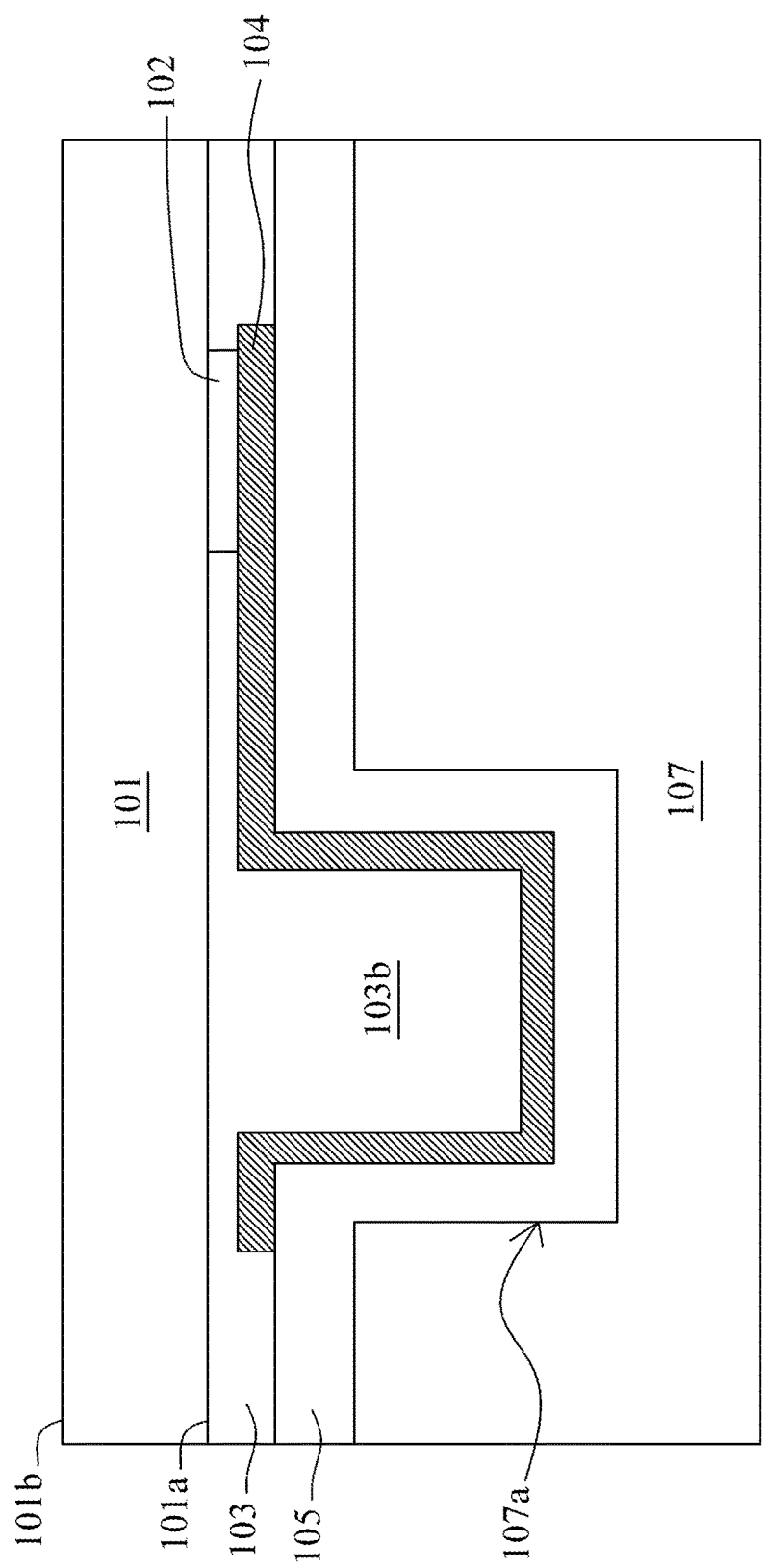

In step 606, the substrate 101 is bonded with the first passivation 103 as shown in FIG. 44. In some embodiments, the pad 102 is inserted into the first passivation 103 to dispose the pad 102 over the conductive layer 104 during the bonding of the substrate 101 with the first passivation 103. In some embodiments, the first passivation 103 is solidified by curing processes or other suitable processes such that the substrate 101 is bonded with the first passivation 103. In some embodiments, the pad 102 is interfaced and electrically connected with the conductive layer 104 after the bonding. In some embodiments, the pad 102 is encapsulated by the first passivation 103.

Figure 45:
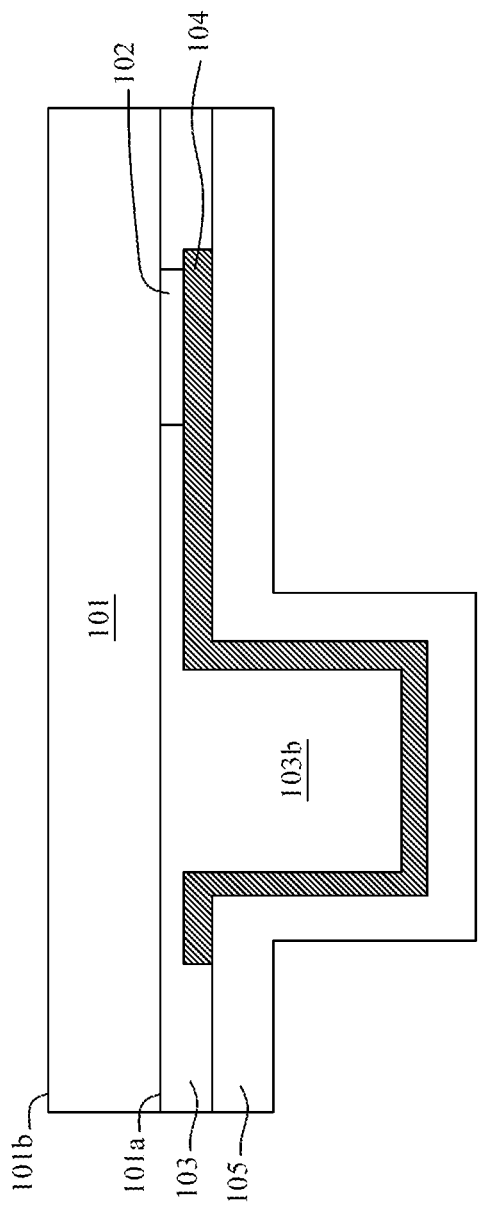
Figure 46:
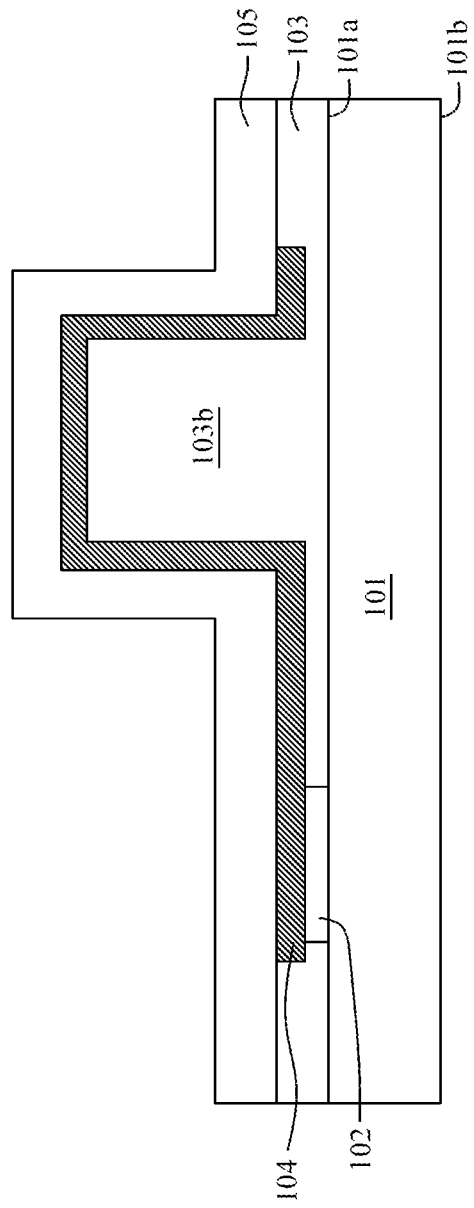

In step 607, the carrier 107 is removed as shown in FIG. 45 or 46. In some embodiments, the second passivation 105 is released from the carrier 107. In some embodiments, the substrate 101 bonded with the first passivation 103 is flipped prior to or after the removal of the carrier 107. In some embodiments, the carrier 107 is reusable such that the carrier 107 can be used again after the removal. In some embodiments, the carrier 107 can be used again, for example, by repeatedly implementing the steps 601-607 to manufacture an intermediate structure as shown in FIG. 45 or 46. In some embodiments, the protrusion 103b is protruded from the first passivation 103 and away from the substrate 101.

Figure 47:
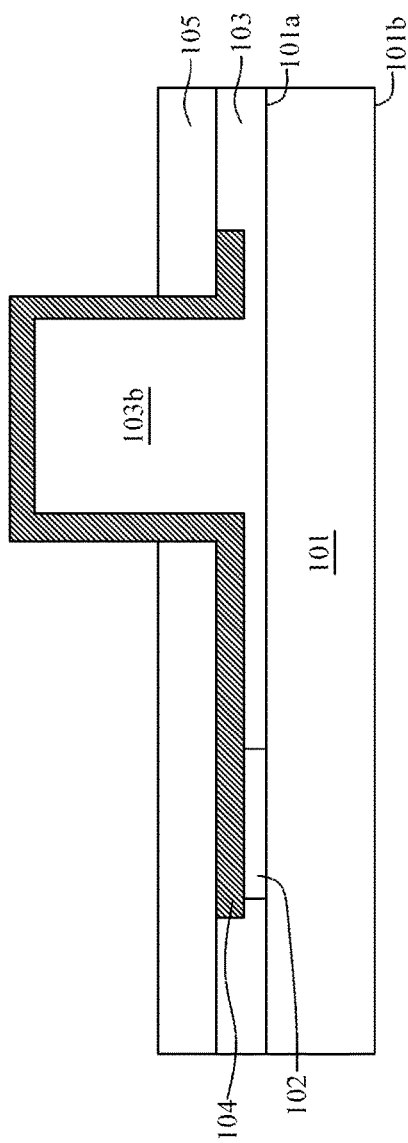

In step 608, a portion of the second passivation 105 is removed to expose a portion of the conductive layer 104 as shown in FIG. 47. In some embodiments, the portion of the second passivation 105 disposed over the protrusion 103b is removed by photolithography and etching processes or any other suitable processes.

Figure 48:
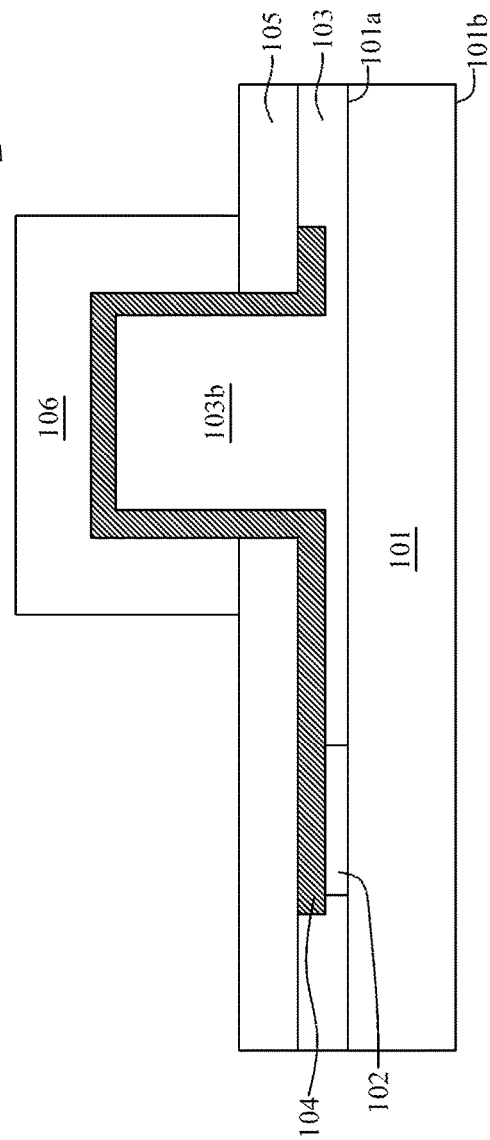

In step 609, a conductive bump 106 is disposed over the portion of the conductive layer 104 exposed from the second passivation 105 as shown in FIG. 48. In some embodiments, the step 609 is similar to the step 409 or the step 509.

Figure 49:
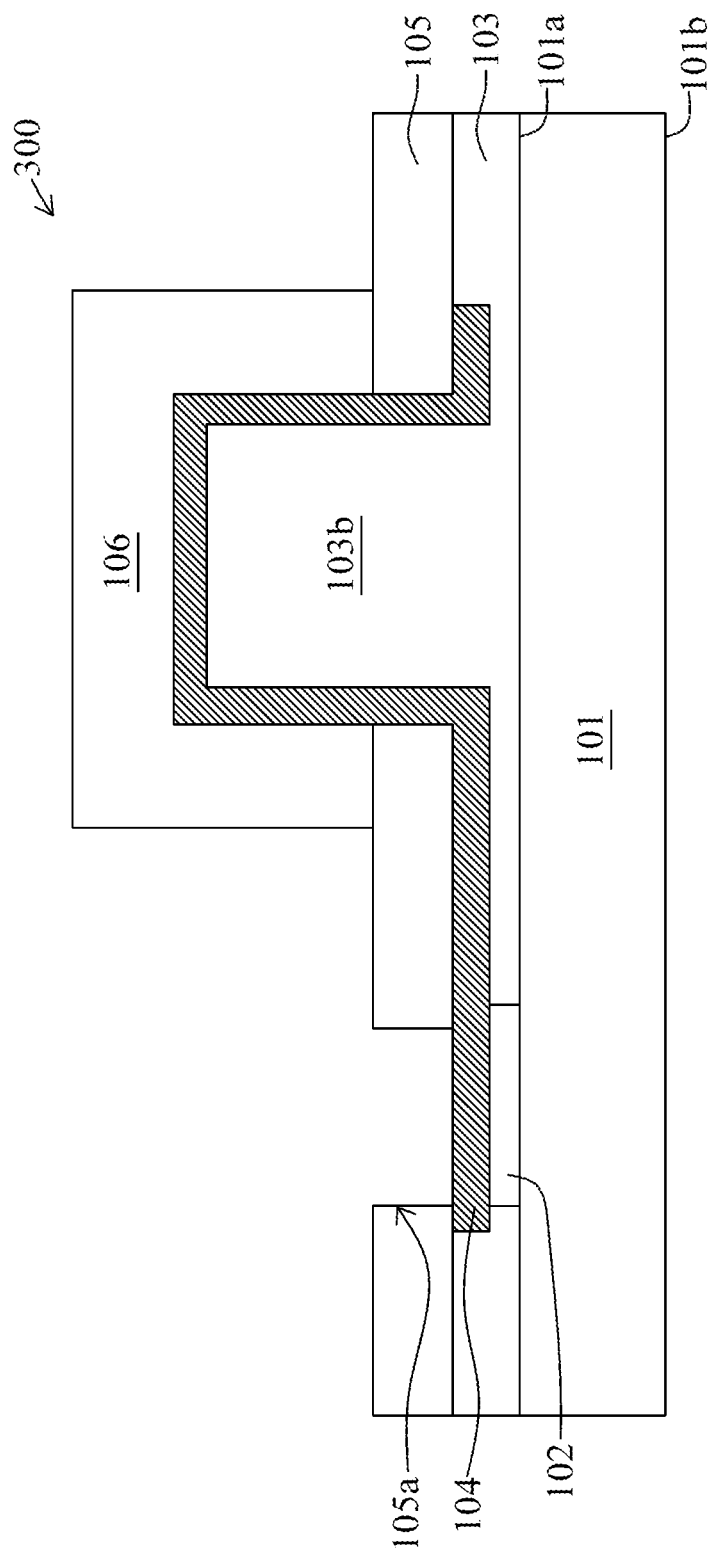

In some embodiments, a portion of the second passivation 105 is removed to form a second opening 105a as shown in FIG. 49. In some embodiments, the semiconductor structure 300 is formed, which has similar configuration as described above or illustrated in FIG. 9 or 10. In some embodiments, the steps 601-607 can be implemented in parallel to the steps 608-609.

Figure 50:
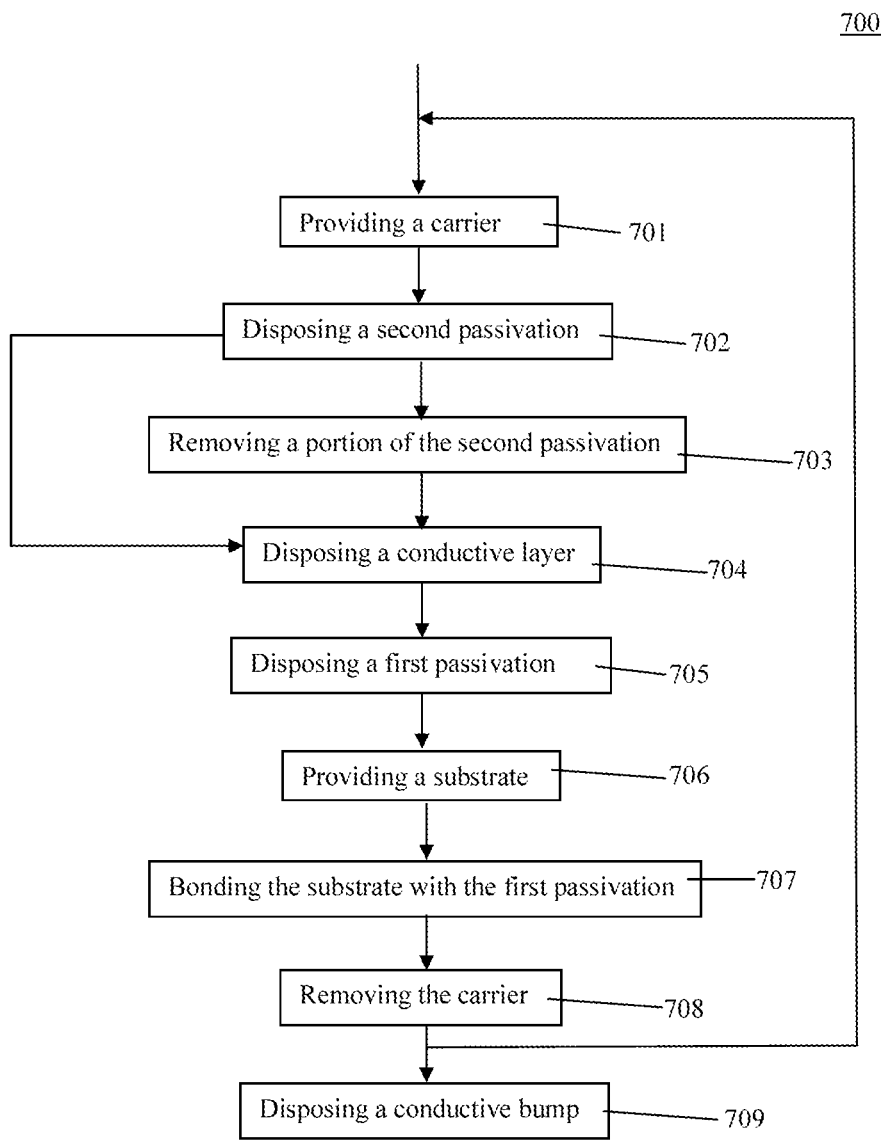
FIG. 50 is a flow chart of a method of manufacturing a semiconductor structure in accordance with some embodiments of the present disclosure.

In some embodiments, the semiconductor structure 300 can be formed by a method 700 of FIG. 50. The method 700 includes a number of operations and the description and illustration are not deemed as a limitation as the sequence of the operations. The method 700 includes a number of steps (701, 702, 703, 704, 705, 706, 707, 708 and 709).

Figure 51:
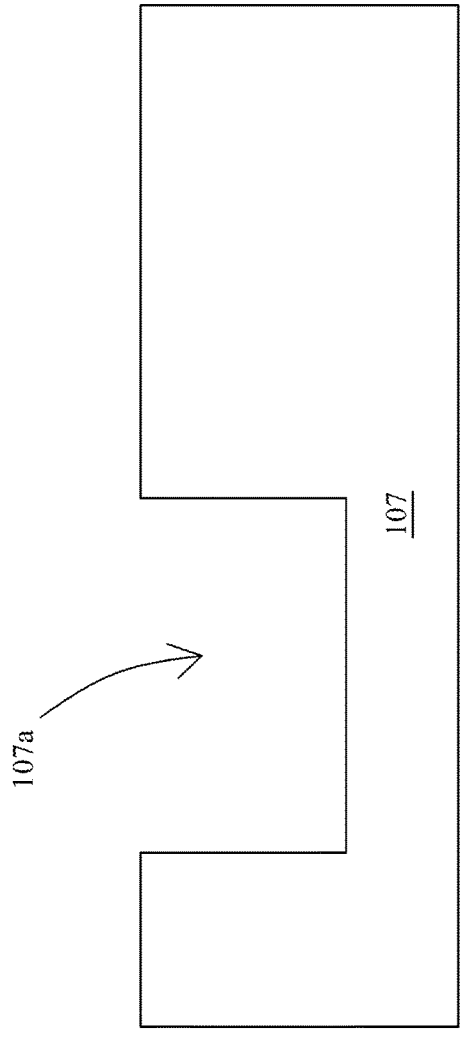
FIGS. 51-62 are schematic views of manufacturing the semiconductor structure by the method of FIG. 50 in accordance with some embodiments of the present disclosure.

In step 701, a carrier 107 including a recess 107a is provided or received as shown in FIG. 51. In some embodiments, the step 701 is similar to the step 601.

Figure 52:
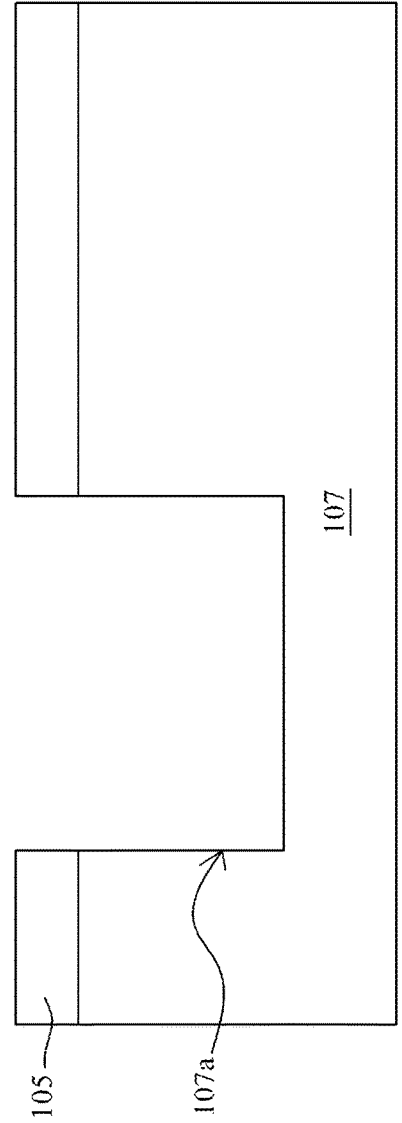
Figure 53:
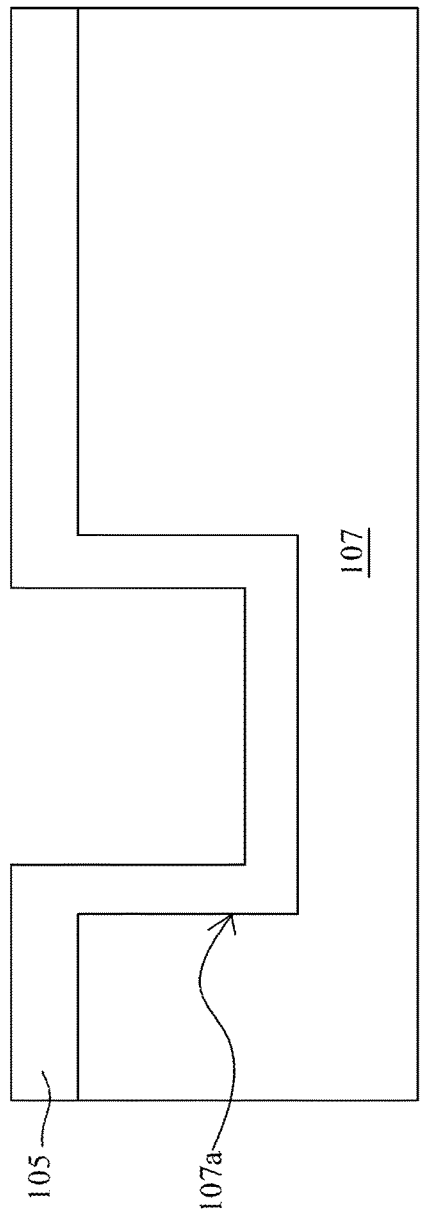

In step 702, a second passivation 105 is disposed over the carrier 107 and within the recess 107a as shown in FIG. 53. In step 703, a portion of the second passivation 105 is removed as shown in FIG. 52.

In some embodiments, the step 703 can be skipped, that the second passivation 105 is only disposed over a surface of the carrier 107 as shown in FIG. 52 during the step 702. In some embodiments, the second passivation 105 is disposed over a surface of the carrier 107. In some embodiments, the second passivation 105 is not disposed within the recess 107a.

In some embodiments, the second passivation 105 is disposed by CVD, spin coating or any other suitable processes. In some embodiments, the second passivation 105 has similar configuration as described above or illustrated in any one of FIGS. 1-10.

In some embodiments, a release film is disposed over the carrier 107 and along the recess 107a prior to the disposing of the second passivation 105. In some embodiments, the release film is configured to facilitate a removal of the carrier 107 from the second passivation 105, and thus the second passivation 105 can be released from the carrier 107 later.

Figure 54:
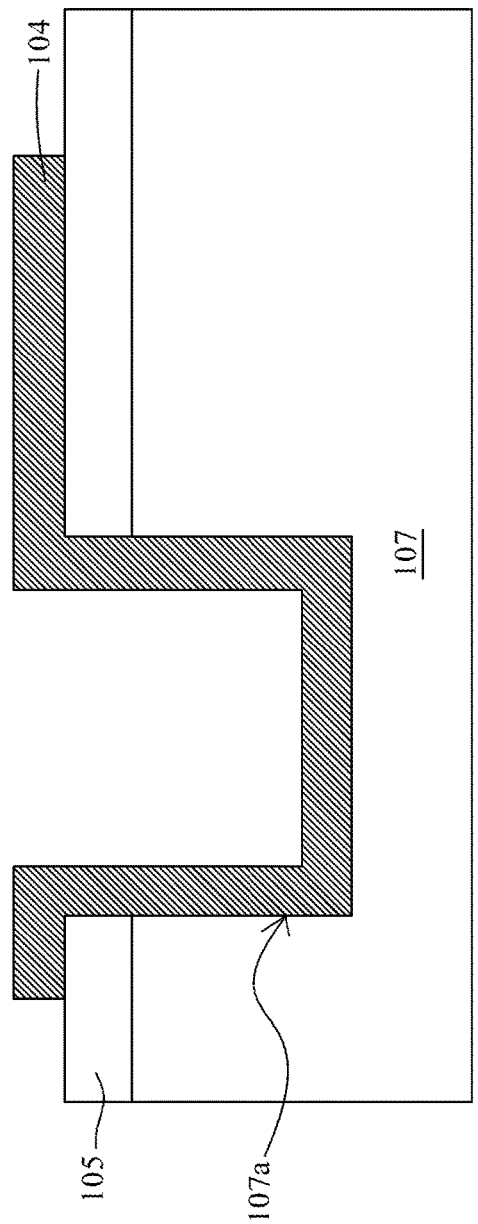

In step 704, a conductive layer 104 is disposed over the second passivation 105 as shown in FIG. 54. In some embodiments, the conductive layer 104 is disposed conformal to the second passivation 105. In some embodiments, a portion of the conductive layer 104 is disposed within the recess 107a. In some embodiments, the conductive layer 104 is disposed by plating, electroplating or any other suitable processes. In some embodiments, the conductive layer 104 has similar configuration as described above or illustrated in any one of FIGS. 1-10.

Figure 55:
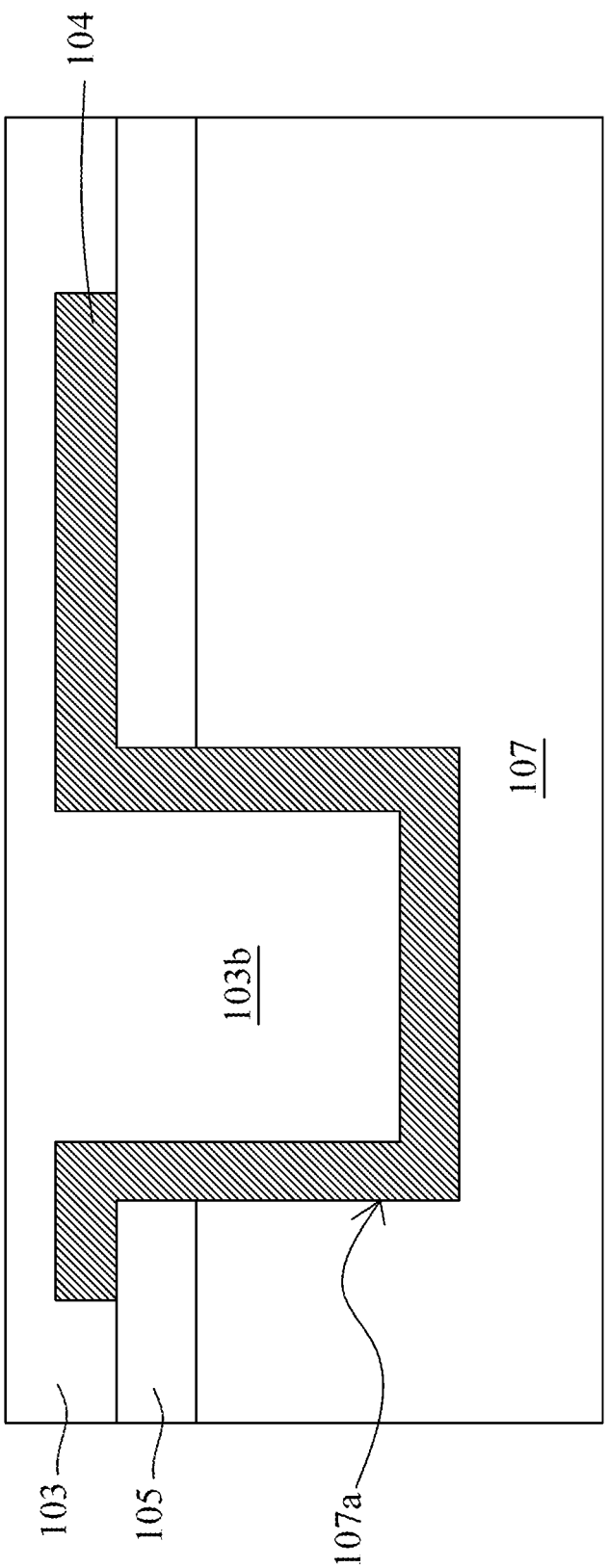

In step 705, a first passivation 103 is disposed over the conductive layer 104 and the second passivation 103 as shown in FIG. 55. In some embodiments, the step 705 is similar to the step 604.

Figure 56:
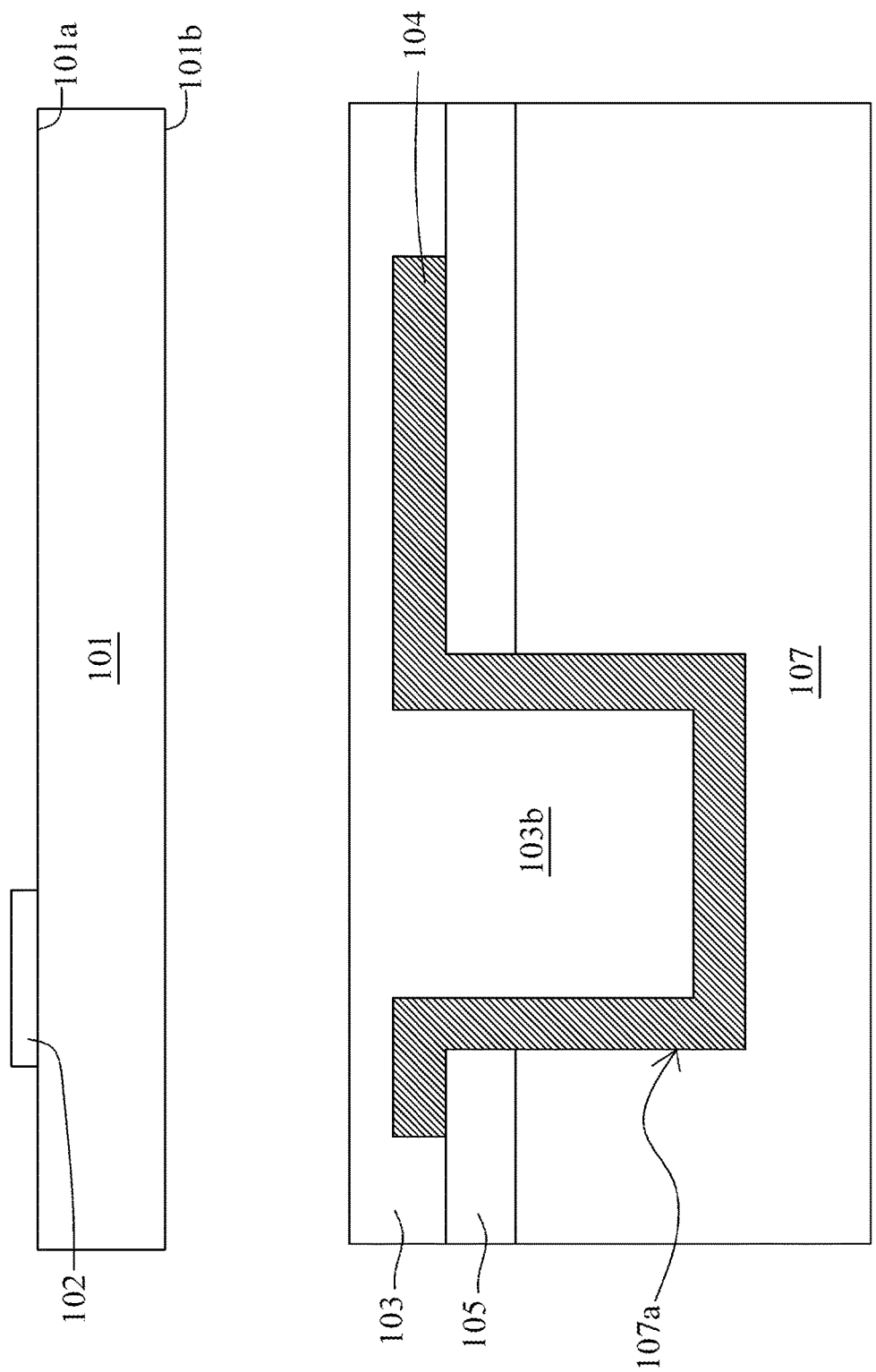
Figure 57:
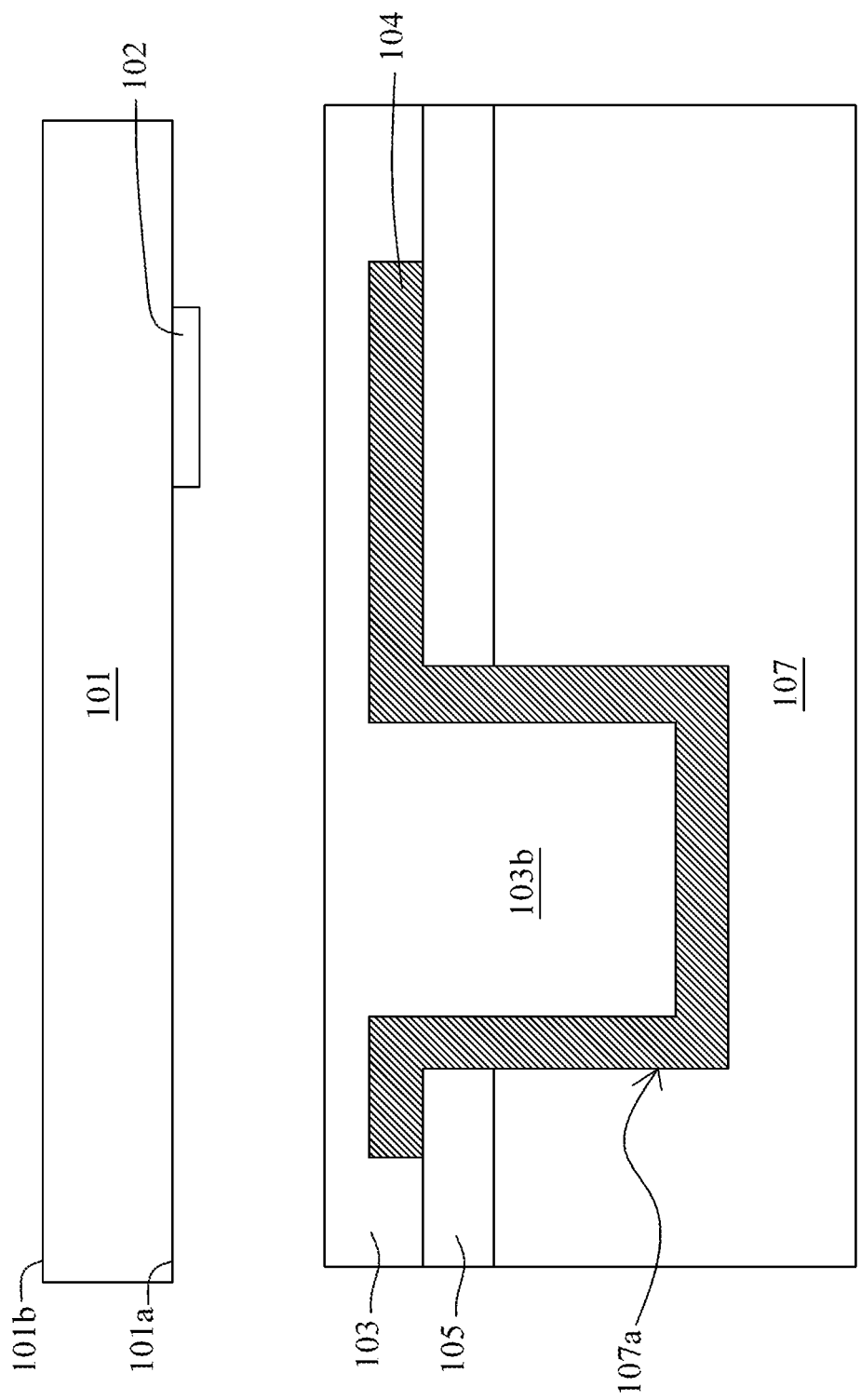

In step 706, a substrate 101 including a pad 102 is provided or received as shown in FIG. 56. In some embodiments, the step 706 is similar to the step 605. In some embodiments, the substrate 101 and the pad 102 are flipped as shown in FIG. 57.

Figure 58:
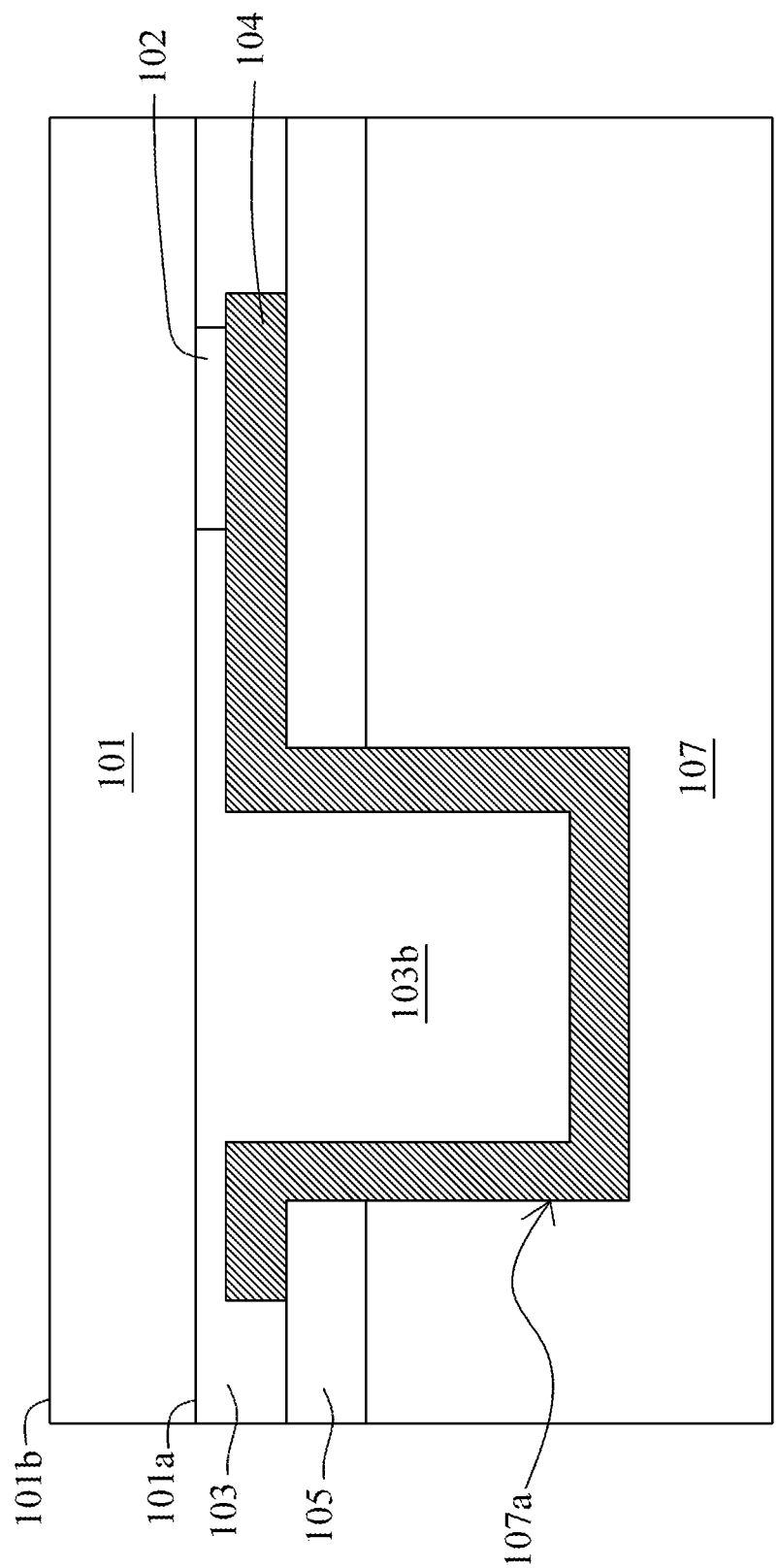

In step 707, the substrate 101 is bonded with the first passivation 103 as shown in FIG. 58. In some embodiments, the step 707 is similar to the step 606.

Figure 59:
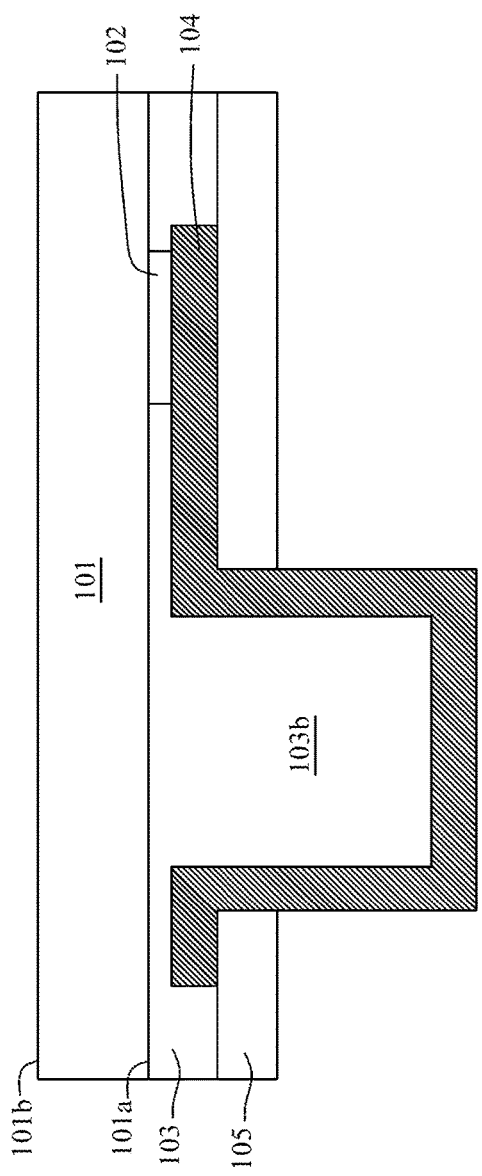
Figure 60:
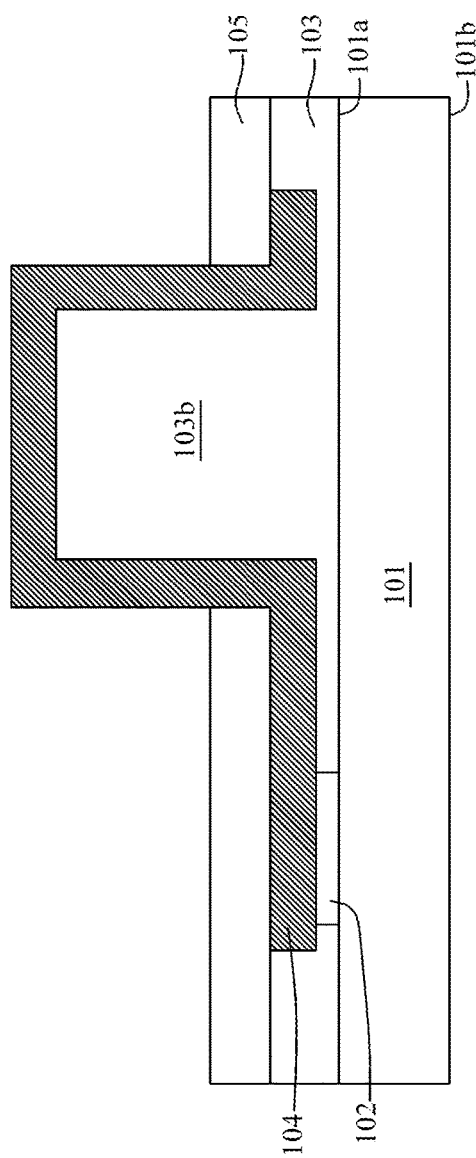

In step 708, the carrier 107 is removed as shown in FIG. 59 or 60. In some embodiments, the step 708 is similar to the step 607.

Figure 61:
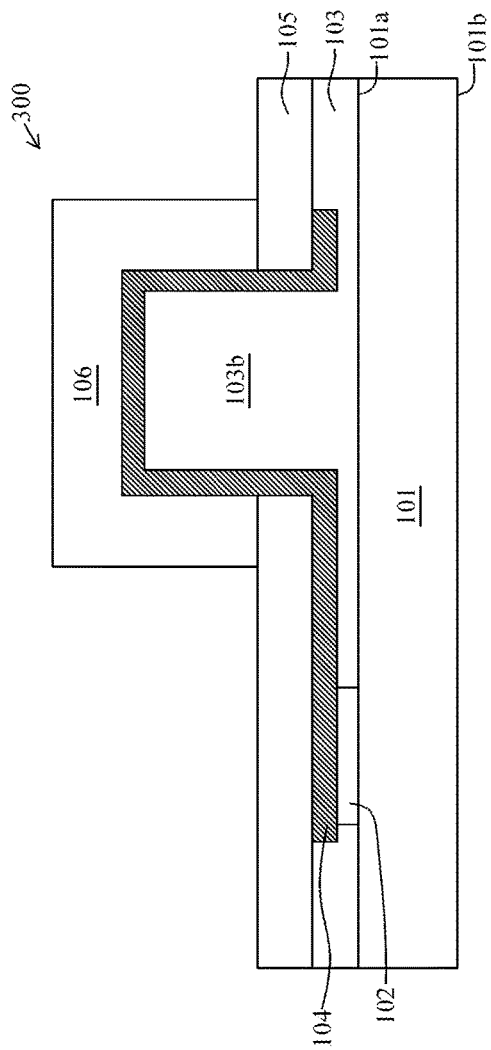

In step 709, a conductive bump 106 is disposed over the portion of the conductive layer 104 exposed from the second passivation 105 as shown in FIG. 61. In some embodiments, the step 709 is similar to the step 609.

Figure 62:
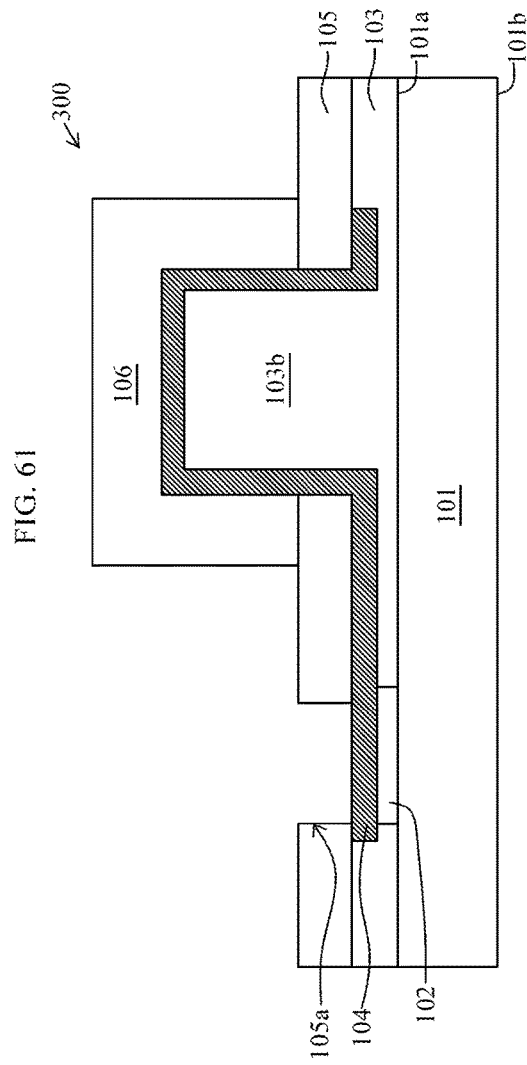

In some embodiments, a portion of the second passivation 105 is removed to form a second opening 105a as shown in FIG. 62. In some embodiments, the semiconductor structure 300 is formed, which has similar configuration as described above or illustrated in FIG. 9 or 10. In some embodiments, the steps 701-708 can be implemented in parallel to the step 709.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor structure, comprising:
    providing a carrier including a recess;
    disposing a second dielectric layer of a first passivation over the carrier and filling the recess;
    providing a substrate including a pad and a first dielectric layer of the first passivation disposed thereon, wherein the pad is covered with the first dielectric layer before bonding the first dielectric layer with the second dielectric layer;
    bonding the first dielectric layer with the second dielectric layer;
    removing the carrier;
    removing a portion of the first passivation to expose a portion of the pad;
    disposing a conductive layer over the first passivation and the portion of the pad;
    disposing a second passivation over the conductive layer, wherein the first passivation includes a protrusion protruded from the first passivation and away from the substrate, and the conductive layer disposed over the protrusion is exposed from the second passivation.

2. The method of claim 1, further comprising:
    disposing a release film over the carrier and the recess prior to the disposing of the first passivation.

3. The method of claim 1, wherein the disposing of the first passivation includes spin coating.

4. The method of claim 1, wherein the disposing of the conductive layer includes plating or electroplating or electroless plating.

5. The method of claim 1, wherein the protrusion is formed within the recess.

6. The method of claim 1, wherein a portion of the first dielectric layer and a portion of the second dielectric layer are removed to expose the portion of the pad.

7. The method of claim 1, wherein the first passivation includes a first dielectric layer and a second dielectric layer, the first dielectric layer is disposed over the substrate, covers the pad and includes the protrusion protruded from the first dielectric layer and away from the substrate, the second dielectric layer is disposed conformal to the first dielectric layer and the protrusion, and a portion of the first dielectric layer and a portion of the second dielectric layer are removed to expose the portion of the pad.

* * * * *